(12) United States Patent
Kim et al.

(10) Patent No.: US 7,969,255 B2
(45) Date of Patent: Jun. 28, 2011

(54) PRINTED CIRCUIT BOARD HAVING SIGNAL LINE ISOLATION PATTERNS FOR DECREASING WWAN NOISE

(75) Inventors: Sung Young Kim, Namyul-ri (KR); Jin Woo Lee, Seoul (KR)

(73) Assignee: LG. Display Co. Ltd., Seoul (KR)

( * ) Notice: Subject to any disclaimer, the term of this patent is extended or adjusted under 35 U.S.C. 154(b) by 130 days.

(21) Appl. No.: 12/265,167

(22) Filed: Nov. 5, 2008

(65) Prior Publication Data

US 2009/0267702 A1   Oct. 29, 2009

(30) Foreign Application Priority Data

Apr. 24, 2008   (KR) .................. 10-2008-0038245

(51) Int. Cl.
*H01P 3/08* (2006.01)

(52) U.S. Cl. ................... 333/1; 333/5; 333/238

(58) Field of Classification Search .......... 333/1, 4, 333/5, 238, 246
See application file for complete search history.

(56) References Cited

U.S. PATENT DOCUMENTS

| | | | | |
|---|---|---|---|---|
| 6,040,524 A * | 3/2000 | Kobayashi et al. | ............. | 174/36 |
| 7,170,361 B1 * | 1/2007 | Farnworth | ......................... | 333/1 |
| 2008/0088007 A1 * | 4/2008 | Quach et al. | .................. | 257/691 |
| 2008/0218285 A1 * | 9/2008 | Yeh | ................................. | 333/1 |

* cited by examiner

*Primary Examiner* — Benny Lee
(74) *Attorney, Agent, or Firm* — Brinks Hofer Gilson & Lione

(57) ABSTRACT

A printed circuit board (PCB) capable of decreasing wireless wide area network (WWAN) noise generated due to internal signal interference occurring in the PCB is disclosed. The PCB printed circuit board includes a first layer, a second layer, and at least one insulating layer formed between the first and second layers. The PCB board further includes a first signal line group disposed on the first layer while including a plurality of first signal lines each supplying a first signal, isolation patterns disposed on the first layer such that the isolation patterns are arranged between adjacent ones of the first signal lines, respectively, to prevent the adjacent first signal lines from interfering with each other, and a second signal line group disposed on the second layer while including a plurality of second signal lines each supplying a second signal different from the first signal. The second signal line group corresponds to the isolation patterns.

12 Claims, 30 Drawing Sheets

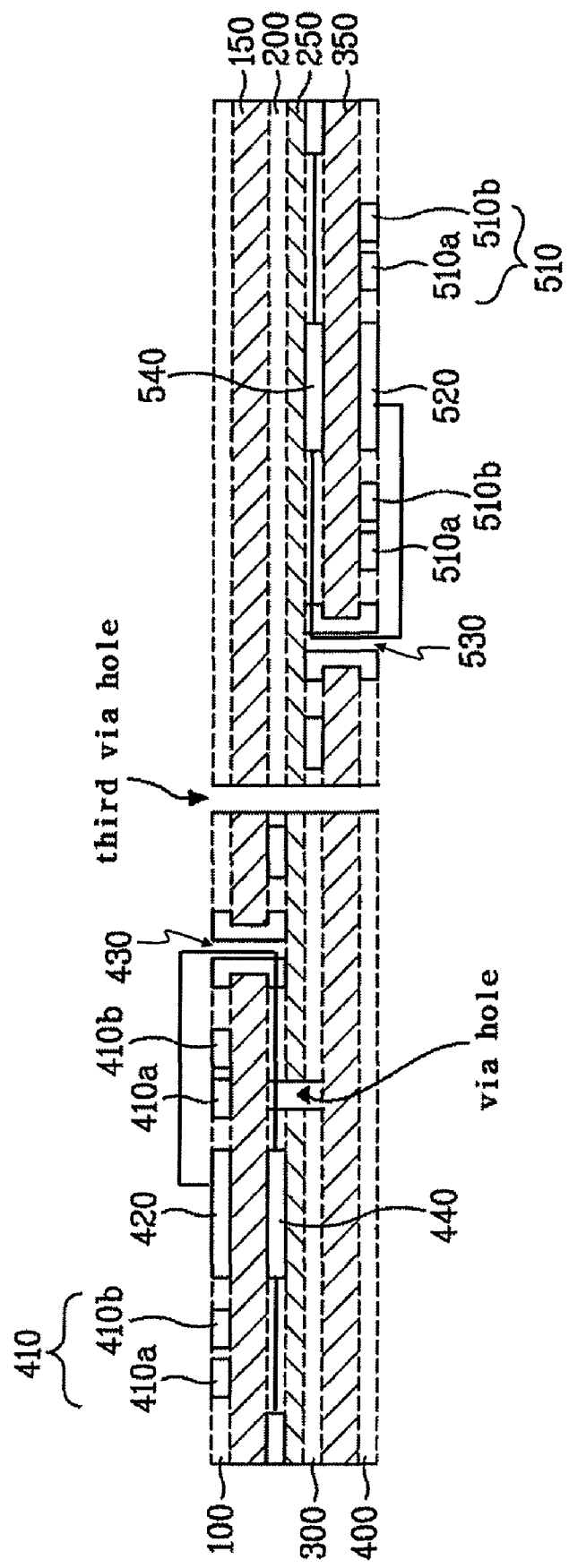

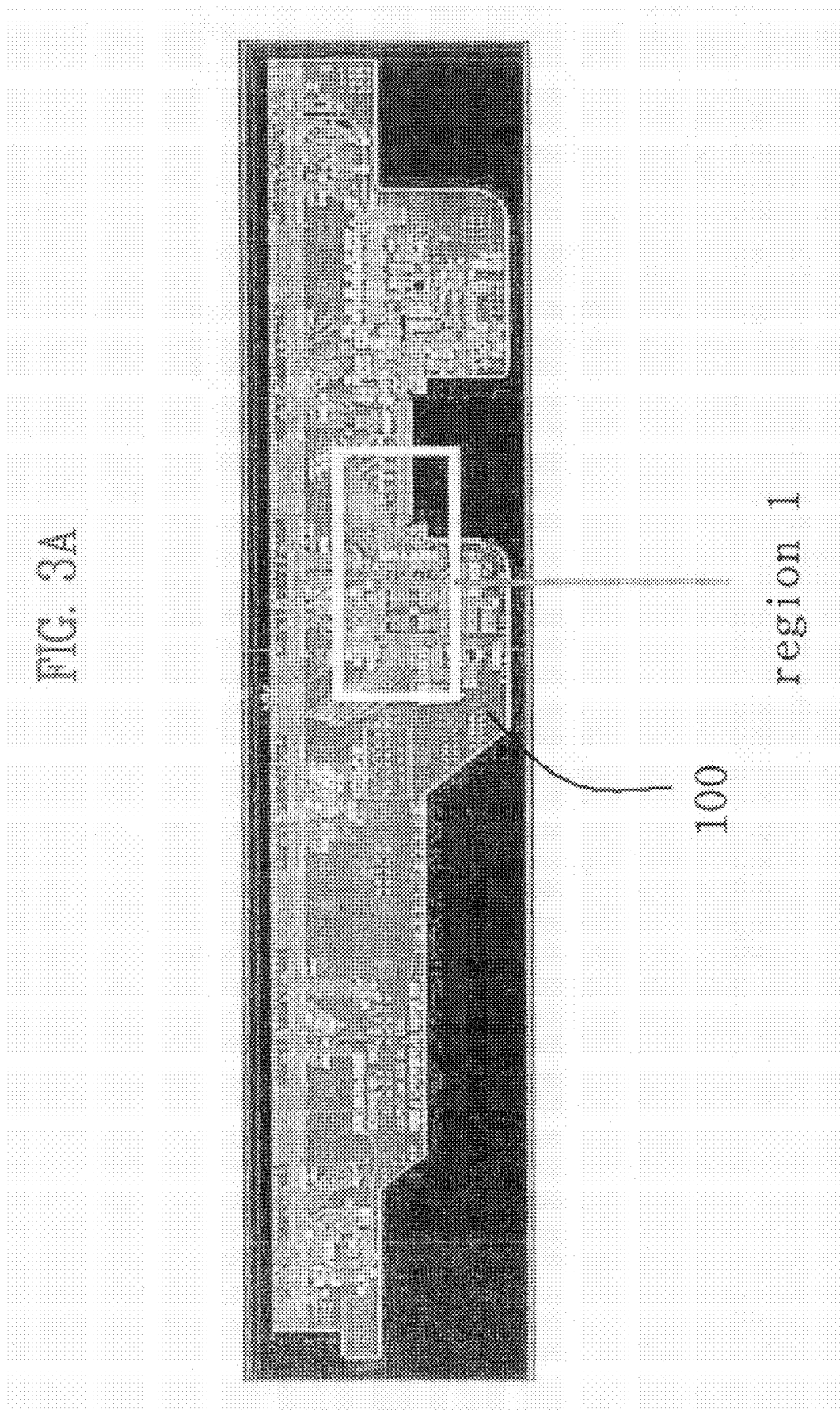

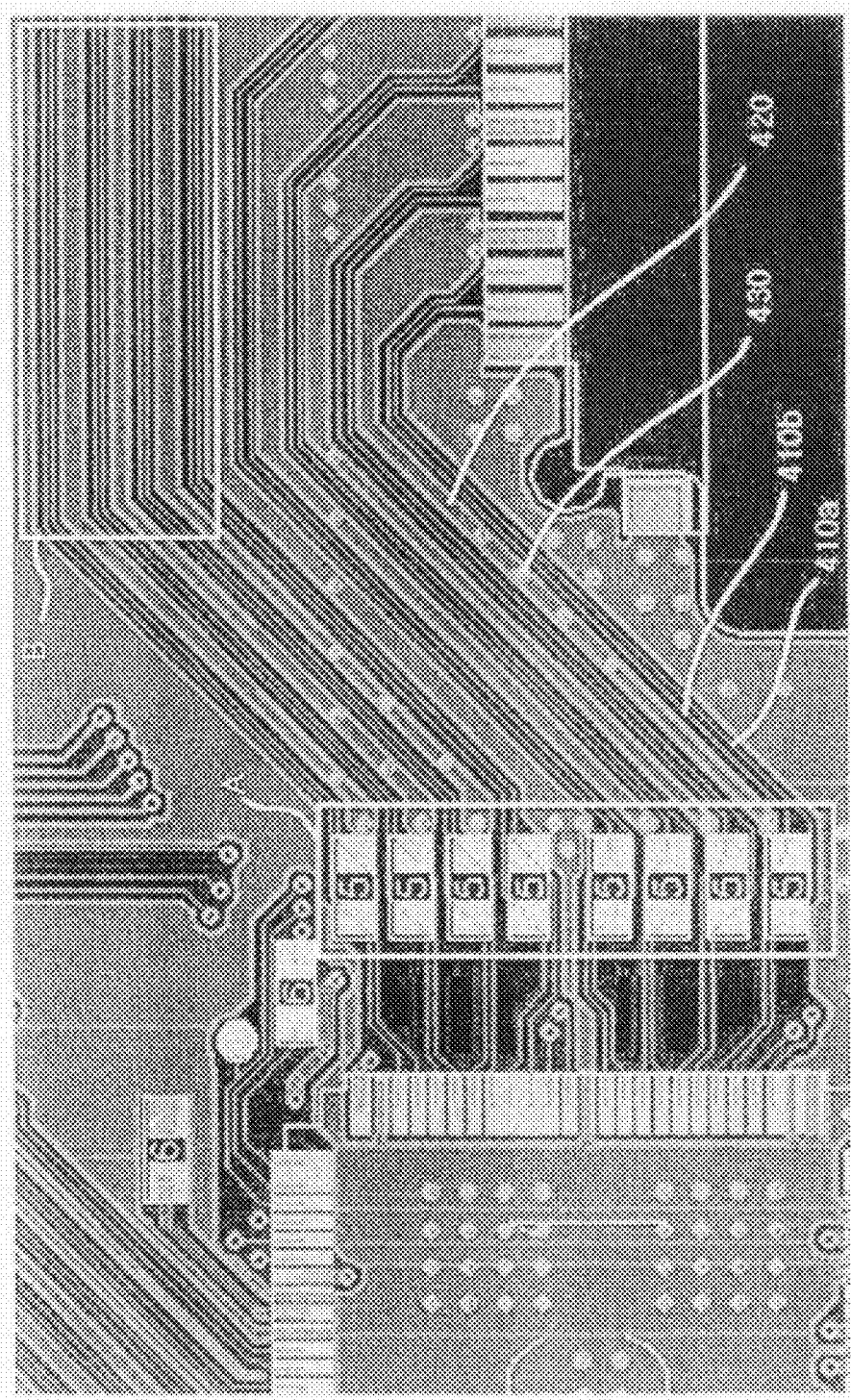

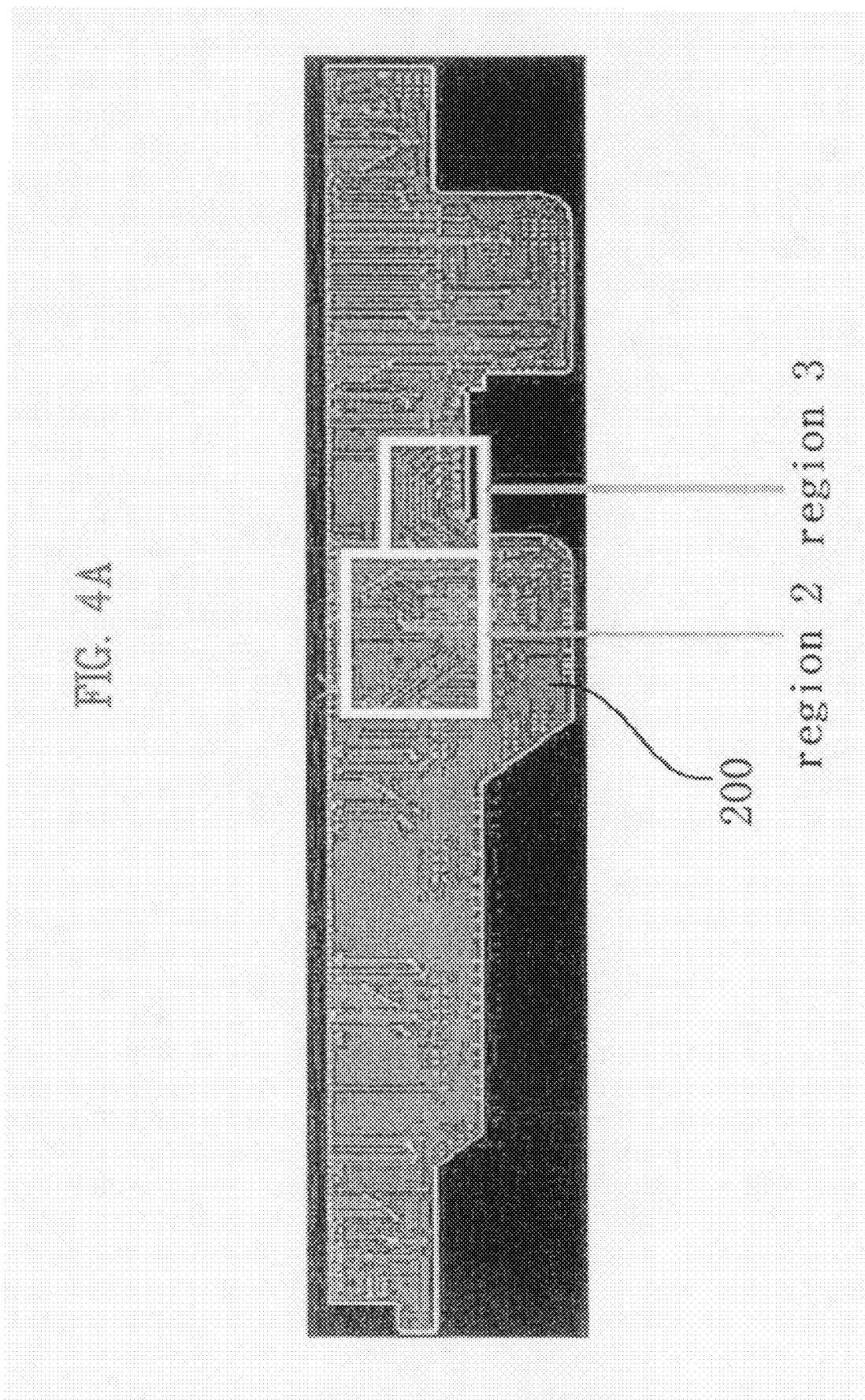

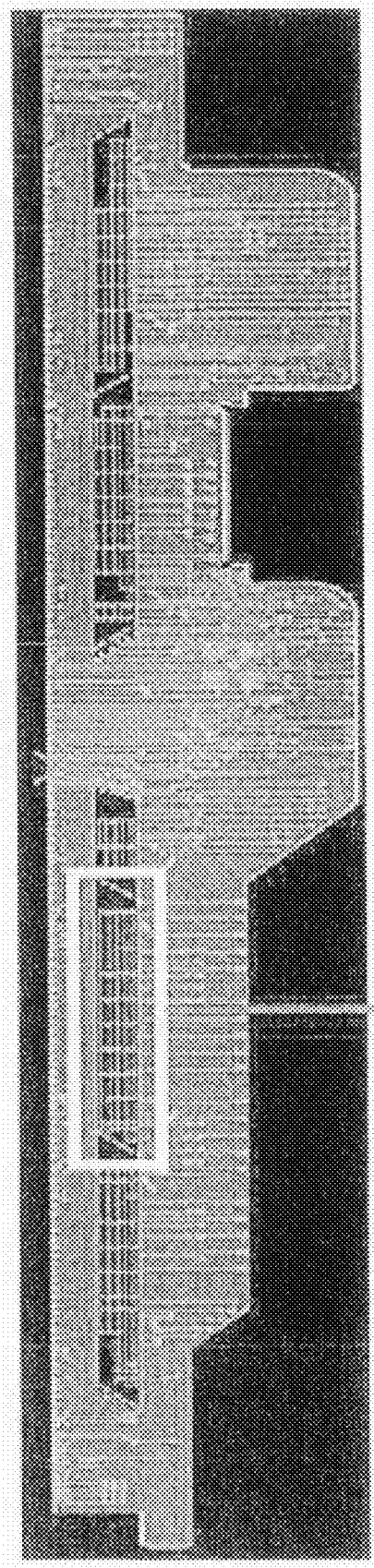

region 5

PRINTED CIRCUIT BOARD HAVING SIGNAL LINE ISOLATION PATTERNS FOR DECREASING WWAN NOISE

This application claims the benefit of the Korean Patent Application No. 10-2008-0038245, filed on Apr. 24, 2008 which is hereby incorporated by reference as if fully set forth herein.

BACKGROUND OF THE INVENTION

1. Field of the Invention

The present invention relates to a printed circuit board, and more particularly, to a printed circuit board for a liquid crystal display device widely used in notebook computers, which is capable of decreasing wireless wide area network (WWAN) noise.

2. Discussion of the Related Art

With the progress of an information-dependent society, the demand for various display devices has increased. To meet such a demand, efforts have recently been made to research flat panel display devices such as liquid crystal display (LCD) devices, plasma display panels (PDPs), electro-luminescent display (ELD) devices, vacuum fluorescent display (VFD) devices, and the like. Some types of such flat panel display devices are being practically applied to various appliances for display purposes.

In particular, LCDs have been widely used in association with mobile image display devices because they have the advantages of superior picture quality, lightness, thinness, and low power consumption. Various applications of LCDs are being developed in association not only with mobile image display devices, such as monitors of notebook computers and other computers, but also monitors of TVs, or other monitors. Thus, such an LCD may be a most representative flat panel display device.

In particular, notebook computers, in which portability is an important feature, different from desktop computers mainly used in fixed spaces such as offices or schools, mainly use an LCD device to output image information.

Such an LCD device includes an LCD panel constituted by two substrates assembled to face each other via a liquid crystal layer interposed between the substrates, a backlight unit for irradiating light to the LCD panel, to enable rendering of an image, and a circuit for supplying signals to drive the LCD panel. The circuit includes a printed circuit board (PCB), on which a timing controller for supplying signals received from a system to the LCD panel in a re-arranged state, and other components are mounted.

The PCB not only functions as lines for supplying signals, but also functions to mechanically fix the timing controller and other components, for the mounting thereof. Such a PCB is classified, in accordance with the structure thereof, into a single layer PCB, in which a copper thin film layer is formed only on one surface of a resin layer, a dual layer PCB, in which copper thin film layers are formed on opposite surfaces of a resin layer, respectively, and a multilayer PCB, in which resin layers and copper thin film layers are alternately laminated. Recently, the multilayer PCB has been mainly used in that an increased number of signal lines can be integrated in the multilayer PCB in accordance with the development of laminating techniques.

The interest in a ubiquitous environment enabling access to a network, such as the Internet, without regard to location and time is increasing. As a result, the utilization of notebook computers, which are very portable, is also increasing.

Also, various techniques for enabling access to a wireless communication network, in particular, a wireless wide area network (WWAN), using a notebook computer are being developed.

However, when a desired task is conducted under the condition in which access to a WWAN is obtained using a notebook computer, it is very important to decrease noise generated due to interference between signals generated from the notebook computer and signals or electromagnetic waves generated from other electronic appliances arranged around the notebook computer, or internal signal interference occurring in the notebook computer.

The LCD device, which is used to output image information from the notebook computer, has a problem in that electromagnetic waves are generated from an inverter for driving the backlight unit. Furthermore, the LCD device generates signal interference when the notebook computer accesses and communicates with a WWAN, due to various signals supplied to various components mounted on the PCB, for example, the timing controller, and signal lines formed on the PCB. As a result, there is a problem in that WWAN noise is generated.

The WWAN noise degrades the quality of wireless communication. In a severe case, the WWAN noise applies a load to hardware, thereby degrading the reliability of the associated equipment.

SUMMARY OF THE INVENTION

A printed circuit board comprises a first layer, a second layer, and at least one insulating layer disposed between the first and second layers further comprises: a first signal line group on the first layer while including a plurality of first signal lines each supplying a first signal; isolation patterns on the first layer such that the isolation patterns are arranged between adjacent ones of the first signal lines, respectively, to prevent the adjacent first signal lines from interfering with each other; and a second signal line group on the second layer while including a plurality of second signal lines each supplying a second signal different from the first signal, wherein the second signal line group corresponds to the isolation patterns.

For reference, the second signal line group corresponding to the isolation patterns means that the second signal line group and isolation patterns on the first and second layers are parallel to each other.

Since the isolation patterns arranged between the adjacent ones of the first signal lines on the first layer and the second signal line group on the second layer correspond to each other, the printed circuit board according to the present invention obtains desired impedance matching. It is also possible to decrease WWAN noise generated during WWAN communications, and thus to improve wireless communication conditions. Furthermore, the PCB can be applied to an image information display device for a portable electronic appliance suitable for a ubiquitous environment, such as a notebook computer.

In addition, a reduction in manufacturing costs can be achieved because it is unnecessary to use a separate process for decreasing WWAN noise.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings:

FIG. 2 is a sectional view illustrating a multilayer PCB according to a second embodiment of the present invention;

FIG. 3A is a view illustrating an example of a first layer in the multilayer PCB according to the second embodiment of the present invention;

FIG. 3B is an enlarged view illustrating a region 1 in FIG. 3A;

FIG. 4A is a view illustrating an example of a ground layer in the multilayer PCB according to the second embodiment of the present invention;

FIG. 5A is a view illustrating an example of a power supply layer in the multilayer PCB according to the second embodiment of the present invention;

DETAILED DESCRIPTION OF THE EMBODIMENTS

Reference will now be made in detail to the embodiments of the present invention associated with a backlight unit, examples of which are illustrated in the accompanying drawings.

First, a printed circuit board (PCB) according to a first embodiment of the present invention will be described in detail.

The PCB according to the first embodiment of the present invention includes a first layer, a second layer, and at least one insulating layer formed between the first and second layers.

A first signal line group is formed on the first layer. The first signal line group includes a plurality of first signal lines each supplying a first signal. Isolation patterns are also formed on the first layer such that they are arranged between adjacent ones of the first signal lines, respectively, to prevent the adjacent first signal lines from interfering with each other.

A second signal line group including a plurality of second signal lines each supplying a second signal different from the first signal is formed on the second layer such that the second signal line group corresponds to the isolation patterns.

Figure 1:
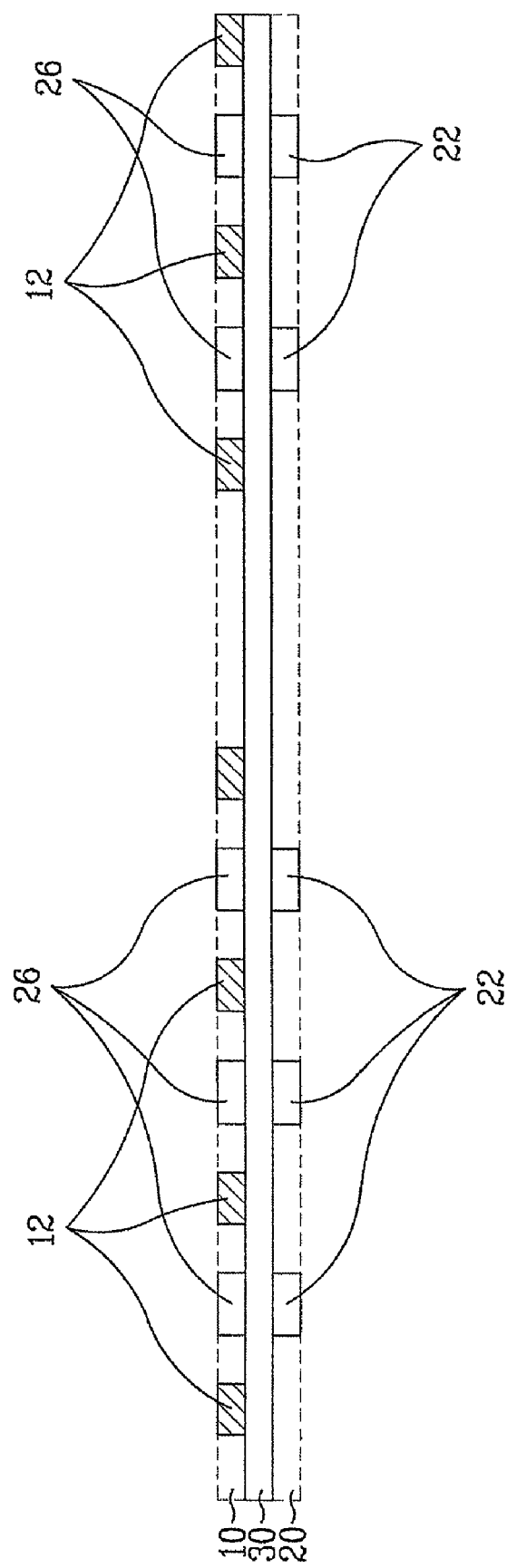
FIG. 1 is a sectional view illustrating a printed circuit board (PCB) according to a first embodiment of the present invention.

FIG. 1 is a sectional view partially illustrating the PCB according to the first embodiment of the present invention, which is a dual layer PCB including a first layer 10, a second layer 20, and a single insulating layer 30 formed between the first and second layers 10 and 20. For reference, it is noted that the same reference numeral used in FIG. 1 and other drawings designates the same constituent element and may not be described in detail in each drawing in which they appear.

As can be seen from FIG. 1, the PCB according to the first embodiment of the present invention includes a first signal line group formed on the first layer 10, the first signal line group includes a plurality of first signal lines 12 each of which supplies a first signal, and isolation patterns 26 formed on the first layer 10 such that the isolation patterns 26 are arranged between adjacent ones of the first signal lines 12, respectively, to prevent the adjacent first signal lines 12 from interfering with each other.

The PCB also includes a second signal line group formed on the second layer 20, the second signal line group includes a plurality of second signal lines 22 each of which supplies a second signal different from the first signal. The second signal line group is formed to correspond to the isolation patterns 26, as shown in FIG. 1.

For reference, the formation of two components to correspond to each other means the formation of the two components at opposite sides of an insulating layer to face each other.

Although not shown, the isolation patterns 26 may be formed to have a floated structure. Alternatively, the isolation patterns 26 may be formed such that they are connected to a copper thin film region, except for a line region connected to the first signal line group. In the latter case, the isolation patterns 26 may be formed such that they are connected to the ends thereof, and connected to the ground through via holes.

That is, when the first layer 10 which is comprised of a copper thin film is patterned to form the first signal line group, the isolation patterns 26 are formed simultaneously with the formation of the first signal line group, such that the isolation patterns 26 are arranged between the adjacent signal lines 12 of the first signal line group, respectively. Meanwhile, each isolation pattern may be formed an intergrated structure.

The second signal line group may also be formed to have a floated structure. Alternatively, the second signal lines 22 of the second signal line group may be formed such that at least one end of each second signal line 22 is connected to each other to form an integrated structure.

The second signal line group may be electrically connected to the isolation patterns 26 through via holes.

Although not shown, components including the timing controller, etc. may be fixedly mounted on the first and second layers in accordance with a soldering process.

The insulating layer 30 may be made of an insulating material such as epoxy resin, phenol resin, or polyimide resin. A reinforcing material such as glass fiber or paper may also be added to the insulating material.

As described above, in the PCB according to the first embodiment of the present invention the isolation patterns 26 respectively arranged between the adjacent first signal lines 12 on the first layer 10 and the second signal lines 22 on the second layer 20 are formed such that they correspond to each other. Accordingly, desired impedance matching is obtained. It is also possible to decrease WWAN noise generated during WWAN communications, and thus to improve wireless communication conditions. Furthermore, the PCB can be applied to an image information display device for a portable electronic appliance suitable for a ubiquitous environment, such as a notebook computer.

The first signal line group may include a plurality of LVDS lines each receiving an low voltage differential signal (LVDS), and the second signal line group may include a plurality of ground lines connected to the ground.

Alternatively, the first signal line group may include a plurality of mini-LVDS signal lines each receiving a mini-LVDS signal, and the second signal line group may include a plurality of ground lines connected to the ground.

Also, the PCB according to the first embodiment of the present invention may include an additional layer between the first and second layers 10 and 20. In this case, the additional layer includes at least one insulating layer and a copper thin film.

Hereinafter, a second embodiment of the present invention will be described in detail.

FIG. 2 is a sectional view partially illustrating a PCB according to the second embodiment of the present invention.

As can be seen from FIG. 2, the PCB according to the second embodiment is a multilayer PCB. The multilayer PCB includes a first layer 100, a first insulating layer 150, a ground layer 200, power supply layer 300, a third insulating layer 350, and a second layer 400, which are sequentially laminated.

The multilayer PCB includes a first signal line group formed on the first layer 100, the first signal line group includes a plurality of first signal lines 410 each receiving a first signal, and first isolation patterns 420 are formed on the first layer 100 such that the first isolation patterns 420 are arranged between adjacent ones of the first signal lines 410, respectively, to prevent the adjacent first signal lines 410 from signal-interfering with each other.

Also, the multilayer PCB also includes a plurality of first ground lines 440 formed on the ground layer 200 such that the first ground lines 440 correspond to the first isolation patterns 420, respectively. The first ground lines 440 are connected to the ground.

The multilayer PCB further includes a second signal line group formed on the second layer 400, the second signal line group includes a plurality of second signal lines 510 each receiving a second signal, and second isolation patterns 520 are formed on the second layer 400 such that the second isolation patterns 520 are arranged between adjacent ones of the second signal lines 510, respectively, to prevent the adjacent second signal lines 510 from signal-interfering with each other.

The multilayer PCB further includes a plurality of second ground lines 540 formed on the power supply layer 300 such that the second ground lines 540 correspond to the second isolation patterns 520, respectively.

For reference, the formation of two components to correspond to each other means the formation of the two components at opposite sides of an insulating layer to face each other.

The first signal line group may include a plurality of LVDS signal lines each receiving an LVDS signal from the external of the multilayer PCB.

In the signal transmission method which uses the above-described LVDS signal, an image signal is transmitted in the form of a pair of analog signals, different from a conventional signal transmission method in which an image signal is transmitted in the form of parallel-digital data. A voltage difference between the two analog signals is then detected, and a digital signal is recovered based on the detected voltage difference. Thus, the signal transmission method using LVDS signals is a signal transmission method capable of transmitting data at high speed while using low power. Preferably, each LVDS signal line, which supplies an LVDS signal, is constituted by a pair of lines in accordance with the characteristics of the LVDS signal. Of course, the LVDS signal lines are not limited to such a configuration.

FIG. 2 illustrates the case in which each first signal line 410 is an LVDS signal line constituted by a pair of sub-lines 410a and 410b. Where each first signal line 410 is constituted by a pair of sub-lines, as described above, each first isolation pattern 420 is arranged between the adjacent first signal lines.

Each first isolation pattern 420, which is formed between the adjacent LVDS signal lines in parallel with the LVDS signal lines, provides effects capable of insulating the adjacent LVDS signal lines from each other, and preventing the LVDS signal lines from signal-interfering with each other.

The first isolation patterns 420 may be electrically connected to the ground layer 200 by first via holes 430 passing through the first layer 100, first insulating layer 150, and ground layer 200. Where the first isolation patterns 420 are electrically connected to the ground layer 200, as described above, it is possible to prevent components mounted on the first layer 100 or lines mounted on the first layer 100, for example, the first signal line group, from being damaged by static electricity.

The first isolation patterns 420 may be formed to have a floated structure. Of course, the first isolation patterns 420 may be formed such that they are connected to a copper thin film region, except for a line region connected to the first signal line group. In the latter case, the first isolation patterns 420 may be formed such that they are connected to ends thereof, to form an integrated structure.

The LVDS signal line group and first isolation patterns 420 are formed in accordance with patterning of a copper thin film constituting the first layer 100. The first ground lines 440 are formed in accordance with patterning of a copper thin film constituting the ground layer 200.

The ground layer 200 is electrically connected to the ground. Alternatively, the first ground lines 440 may be formed to have a floated structure. Preferably, the first ground lines 440 are connected to ends thereof, to form an integrated structure. In this case, the formation of the first ground lines 440 is achieved by removing regions defined between the adjacent first ground lines 440 from the ground layer 200 which is comprised of a copper thin film.

The second signal line group, which includes a plurality of second signal lines 510 each receiving the second signal different from the first signal, may be constituted by a plurality of mini-LVDS signal lines each receiving a mini-LVDS signal. Gamma voltage lines and other lines may also be formed on the second layer 400.

Although the LVDS system achieves an enhancement in electromagnetic interference (EMI) characteristics and an enhancement in speed, using reduced voltage swing, as compared to the conventional transistor-to-transistor logic (TTL) system, in which signal swing when data is transmitted from a timing controller to a driver IC corresponds to a supply voltage, the mini-LVDS system, which uses mini-LVDS signals, not only further reduces the voltage swing, as compared to the LVDS system, but also reduces the number of transmission lines in accordance with a new data modulation scheme, thereby achieving a reduction in the current consumption of the overall chip and an enhancement in EMI characteristics.

Each mini-LVDS signal line may also be constituted by one or more pairs of sub-lines. FIG. 2 illustrates the case in which each mini-LVDS signal line is constituted by a pair of sub-lines 510a and 510b. Where each second signal line 510 is constituted by a pair of sub-lines, as described above, each second isolation pattern 520 is arranged between the adjacent second signal lines.

Each second isolation pattern 520, which is formed between the adjacent mini-LVDS signal lines in parallel with the mini-LVDS signal lines, provides effects capable of insulating the adjacent mini-LVDS signal lines from each other, and preventing the mini-LVDS signal lines from signal-interfering with each other.

Also, the second isolation patterns 520 may be electrically connected to the second ground lines 540 by second via holes 530 passing through the second layer 400, third insulating layer 350, and power supply layer 300. Where the second isolation patterns 520 are electrically connected to the second ground lines 540 formed on the power supply layer 300, as described above, it is possible to prevent components mounted on the second layer 400 or lines mounted on the second layer 400, for example, the second signal line group, from being damaged by static electricity.

The second isolation patterns 520 may be formed to have a floated structure. Of course, the second isolation patterns 520 may be formed such that they are connected to a copper thin film region, except for a line region connected to the second signal line group. In the latter case, the second isolation patterns 520 may be formed such that they are connected to ends thereof, to form an integrated structure.

The mini-LVDS signal line group and second isolation patterns 520 are formed in accordance with patterning of a copper thin film constituting the second layer 400. The second ground lines 540 are formed in accordance with patterning of a copper thin film constituting the power supply layer 300.

As shown in FIG. 2, the multilayer PCB may additionally include third via holes (FIG. 2) passing through the ground layer 200, second insulating layer 250, and power supply layer 300, in order to electrically connect the first signal line group formed on the first layer 100 and the second signal line group formed on the second layer 400.

The power supply layer 300 may supply a VCC voltage or a VDD voltage. Of course, the voltage supplied from the power supply layer 300 is not limited to such a voltage.

In addition to the second ground lines 540 which are formed such that they correspond to the second isolation patterns 520 while being electrically connected to the second isolation patterns 520, respectively, lines for supplying power from the external of the PCB to a display panel may be formed on the power supply layer 300. Similarly to the second ground lines 540, the power supply lines may be formed simultaneously with patterning of a copper thin film constituting the power supply layer 300.

The second ground lines 540 may be formed to have a floated structure. In this case, the formation of the second ground lines 540 is achieved by removing regions defined between the adjacent second ground lines 540 from the power supply layer 300, which is comprised of a single copper thin film, such that the second ground lines 540 are prevented from being electrically connected with other lines. Although not shown, the second ground lines 540 may also be electrically connected to the ground layer 200 via third via holes (FIG. 2) passing through the power supply layer 300, second insulating layer 250, and ground layer 200.

Each of the first insulating layer 150, second insulating layer 250, and third insulating layer 350 may be made of an insulating material such as epoxy resin, phenol resin, or polyimide resin. A reinforcing material such as glass fiber or paper may also be added to the insulating material.

As described above, the multilayer PCB according to the second embodiment of the present invention, which includes the sequentially-laminated first layer, first insulating layer, ground layer, second insulating layer, power supply layer, third insulating layer, and second layer, further includes: the first signal line group formed on the first layer while including the first signal lines; the first isolation patterns formed on the first layer such that they are arranged between adjacent ones of the first signal lines, respectively; the first ground lines formed on the ground layer such that they correspond to the first isolation patterns, respectively; the second signal line group formed on the second layer while including the second signal lines; the second isolation patterns formed on the second layer such that they are arranged between adjacent ones of the second signal lines, respectively; and the second ground lines formed on the power supply layer such that they correspond to the second isolation patterns, respectively. In accordance with this configuration, desired impedance matching is obtained. It is also possible to decrease WWAN noise generated during WWAN communications, and thus to improve wireless communication conditions. Furthermore, the multilayer PCB can be applied to an image information display device for a portable electronic appliance suitable for a ubiquitous environment, such as a notebook computer.

Hereinafter, an example of the configuration of the first layer in the PCB according to the second embodiment of the present invention will be described with reference to FIGS. 3A and 3B.

FIG. 3A is a view illustrating an example of the first layer 100 in the PCB according to the second embodiment of the present invention. FIG. 3B is an enlarged view illustrating a region 1 in FIG. 3A, namely, a region where the timing controller is mounted. For reference, FIGS. 3A and 3B show the case in which each first signal line is an LVDS signal line constituted by a pair of sub-lines each receiving a LVDS signal.

As can be seen from FIG. 3B, in the PCB according to the illustrated embodiment of the present invention, a plurality of LVDS signal lines respectively receiving LVDS signals from an external system are formed on the first layer. Each LVDS signal line is constituted by a pair of sub-lines 410a and 410b.

First isolation patterns 420 are formed between adjacent ones of the LVDS signal lines, respectively, such that they are electrically isolated from the LVDS signal lines. The first isolation patterns 420 are electrically connected with the ground layer interposed between the first layer and the first insulating layer, through first via holes 430.

Preferably, the line widths of the first isolation patterns 420 and first signal lines are set such that they have a minimum margin preventing a desired ground state from being removed due to the first via holes 430. The first via holes 430 may be formed at the first isolation patterns 420 such that one first via hole 430 is arranged at one first isolation pattern. Alternatively, a plurality of first via holes 430 may be arranged at one first isolation pattern 420. In the latter case, it is preferred that the spacing between the adjacent first via holes 430 be about 6 mm.

Figure 7:
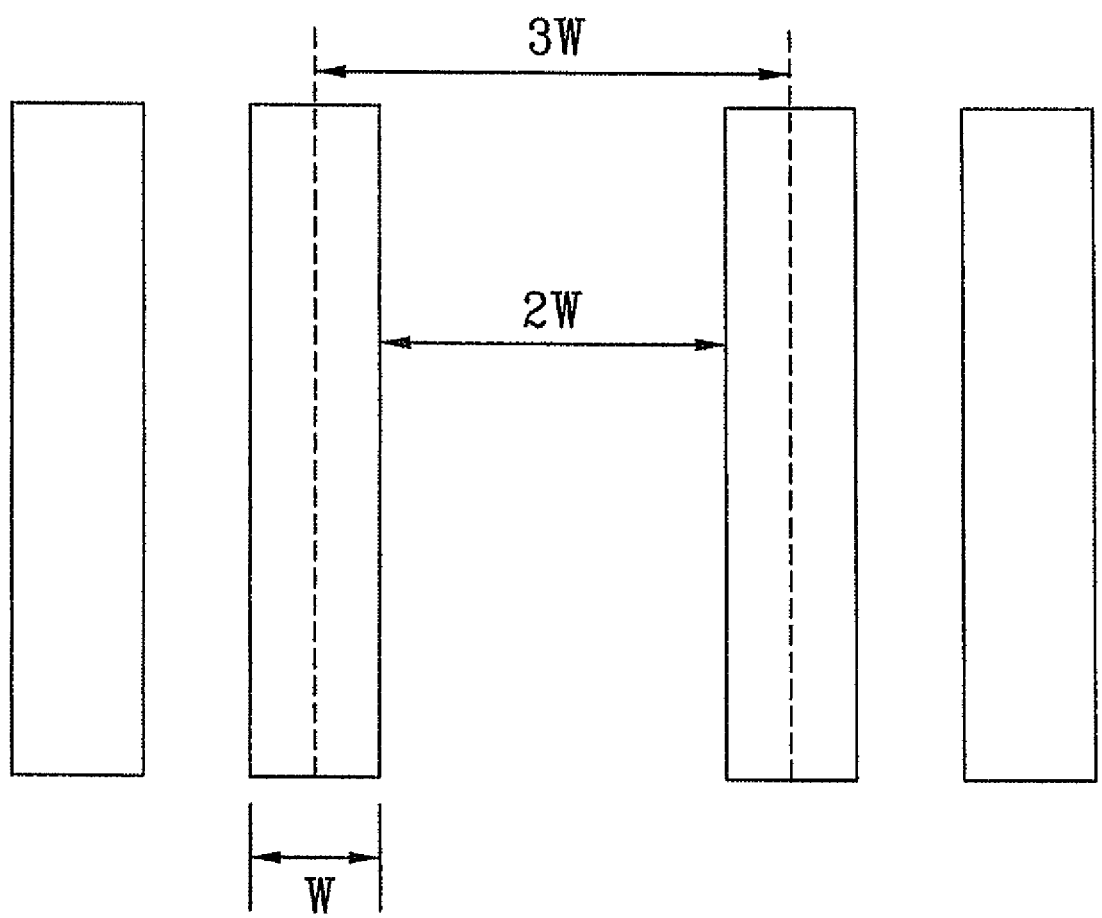
FIG. 7 is a schematic view illustrating the line width and line spacing in a low voltage differential signaling (LVDS) line group in the multilayer PCB according to an exemplary embodiment of the present invention.

When it is assumed that the line width of each sub-line in each LVDS signal line is W in the multilayer PCB according to the illustrated embodiment of the present invention, as shown in FIG. 7, the spacing between the adjacent LVDS signal lines is set to be 2×W. That is, the spacing between the centers of the adjacent sub-lines of the adjacent LVDS signal lines is set to be 3×W.

Although FIG. 3B shows the case in which the first via holes are formed only in regions of the first isolation patterns 420 arranged near regions where components such as resistors are mounted, it is preferred that the first via holes be also formed in regions B of the first isolation patterns 420 arranged apart from the regions where components are mounted.

It is preferred, in terms of a decrease in WWAN noise, that the spacing between adjacent resistors in a termination resistor area A (FIG. 3B) be maximized within a range allowed by a given design margin.

The formation of the LVDS signal line group and first isolation patterns on the first layer is achieved in accordance with patterning of a copper thin film constituting the first layer. Although not shown, components including a timing controller, etc. are mounted on the first layer in accordance with a mechanical fixing method, for example, a surface mounting technology (SMT) method.

Hereinafter, an example of the configuration of the ground layer in the PCB according to the second embodiment of the present invention will be described with reference to FIGS. 4A to 4C.

Figure 4B:
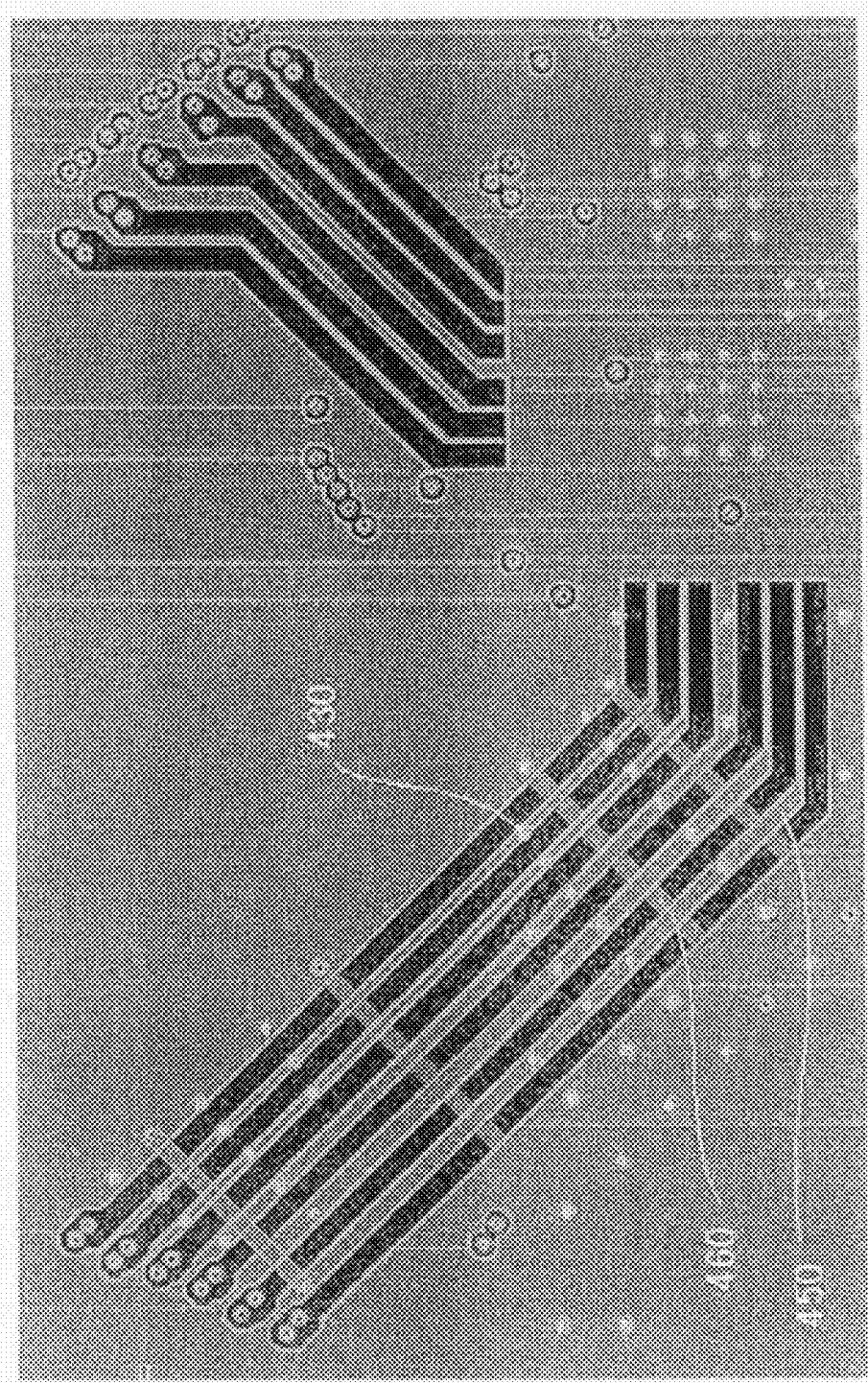
FIG. 4B is an enlarged view illustrating a region 2 in FIG. 4A.

FIG. 4A is a view illustrating an example of the ground layer according to an exemplary embodiment of the present invention. FIGS. 4B and 4C are enlarged views illustrating regions 2 and 3 in FIG. 4A.

Figure 4C:
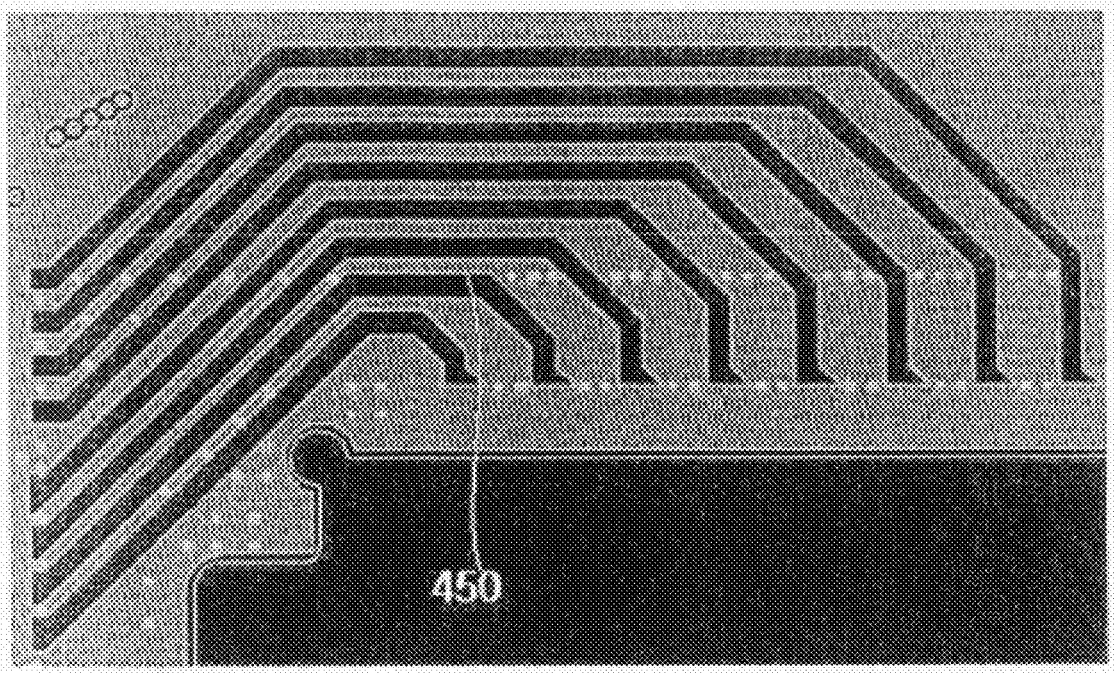
FIG. 4C is an enlarged view illustrating a region 3 in FIG. 4A.

As can be seen from FIGS. 4B and 4C, a plurality of first ground lines 450 (FIG. 4B) are formed on the ground layer in accordance with patterning of a copper thin film constituting the ground layer. The first ground lines 450 are electrically connected with the first isolation patterns formed on the first layer, through first via holes 430 passing through the first layer, first insulating layer, and ground layer. The first ground lines 450 are formed such that they correspond to the first isolation patterns, respectively.

The first ground lines 450 may be formed to have a floated structure. Alternatively, as shown in FIGS. 4B and 4C, the first ground lines 450 may be formed such that the adjacent ones thereof are spaced apart from each other, and such that they are connected to ends thereof without being completely floated, to form an integrated structure. That is, the first ground lines 450 may be formed by removing the copper thin film constituting the ground layer from regions respectively defined between the adjacent ground patterns.

In order to achieve a decrease in WWAN noise, as shown in FIG. 4B, first connecting patterns 460 may be further formed on the ground layer such that they intersect with the adjacent ground lines 450, respectively.

Hereinafter, an example of the configuration of the power supply layer in the PCB according to the second embodiment of the present invention will be described with reference to FIGS. 5A and 5B.

Figure 5B:
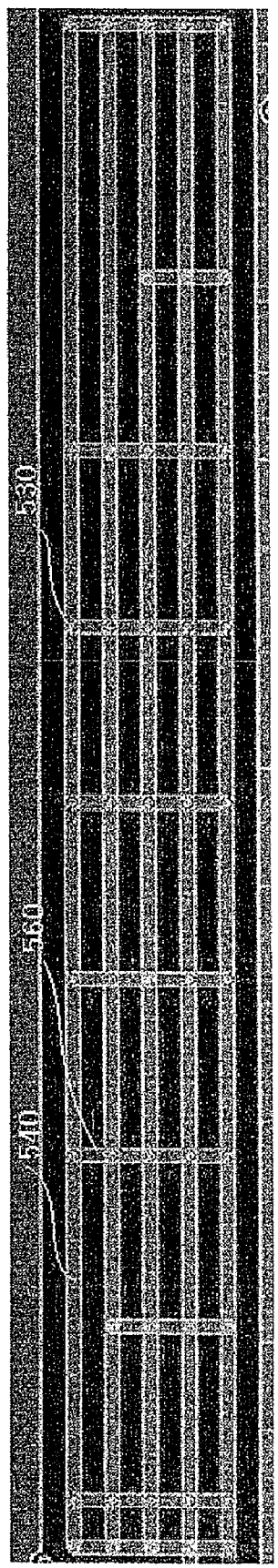
FIG. 5B is an enlarged view illustrating a region 4 in FIG. 5A.

FIG. 5A is a view illustrating an example of the power supply layer according to an exemplary embodiment of the present invention. FIG. 5B is an enlarged view illustrating a region 4 in FIG. 5A.

As can be seen from FIG. 5B, a plurality of second ground lines 540 are formed on the power supply layer such that they correspond to the second isolation patterns formed between the adjacent second signal lines on the second layer, respectively. The second ground lines 540 are electrically connected with the second isolation patterns formed on the second layer, through second via holes 530 passing through the second layer, third insulating layer, and power supply layer.

Each second ground line may be formed with one second via hole or a plurality of second via holes. Where a plurality of second via holes formed at the each second ground line, it is preferred that the spacing between the adjacent second via holes be about 6 mm.

Although not shown, the power supply layer is formed between the ground layer and the second insulating layer. The second insulating layer may be made of an insulating material having mechanical properties of durability and flexibility, for example, polyimide.

As shown in FIG. 5B, the second ground lines 540 are formed such that the adjacent ones thereof are spaced apart from each other, and such that they are floated from other lines arranged therearound on the power supply layer.

Also, it is preferred, in terms of a decrease in WWAN noise, that second connecting patterns 560 be further formed on the power supply layer such that they intersect with the second ground lines 540, as shown in FIG. 5B. It is also preferred that the second via holes 530 be formed at respective intersections of the second connecting patterns 560 and second ground lines 540.

Hereinafter, an example of the configuration of the second layer in the PCB according to the second embodiment of the present invention will be described with reference to FIGS. 6A and 6B.

Figure 6A:
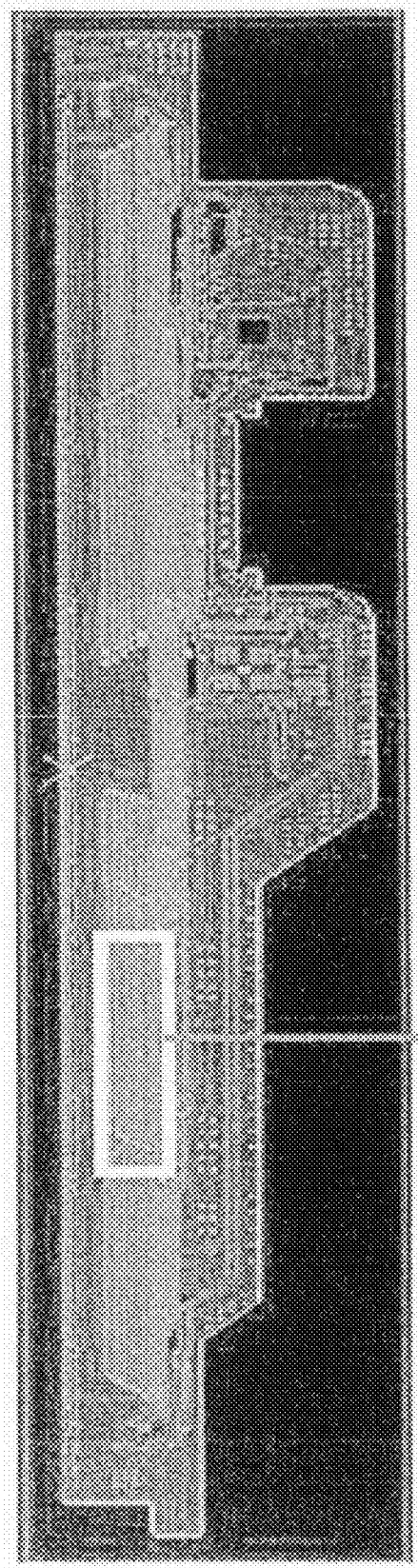
FIG. 6A is a view illustrating an example of a second layer in the multilayer PCB according to the second embodiment of the present invention.

FIG. 6A is a view illustrating an example of the second layer in the PCB according to an exemplary embodiment of the present invention. FIG. 6B is an enlarged view illustrating a region 5 in FIG. 6A.

Figure 6B:
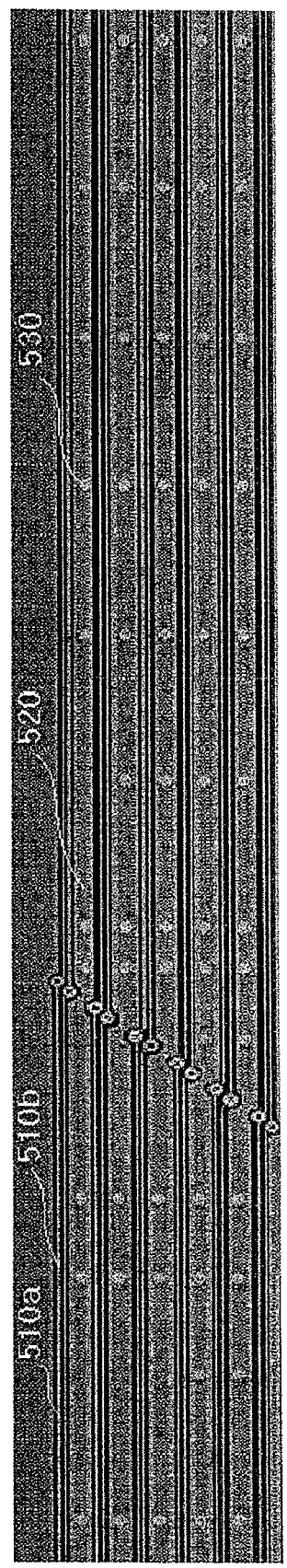
FIG. 6B is an enlarged view illustrating a region 5 in FIG. 6A.

As can be seen from FIG. 6B, a plurality of mini-LVDS signal lines respectively receiving mini-LVDS signals are formed on the second layer. Each mini-LVDS signal line is constituted by a pair of sub-lines 510a and 510b.

Second isolation patterns 520 are formed between adjacent ones of the LVDS signal lines, respectively, such that the second isolation patterns 520 are electrically isolated from the LVDS signal lines. Since the second isolation patterns 520 are electrically isolated from the mini-LVDS signal lines, they can provide an effect capable of signals supplied to the different mini-LVDS signal lines from being interfered with each other.

The second isolation patterns 520 are formed such that they correspond to the second ground lines on the power supply layer, respectively.

The formation of the mini-LVDS signal lines and second isolation patterns 520 on the second layer is achieved in accordance with patterning of a copper thin film constituting the second layer. The second isolation ground patterns 520 are electrically connected with the second ground lines formed on the power supply layer, through the second via holes 530 passing through the second layer, third insulating layer, and power supply layer.

Also, the line width of the second isolation patterns 520 is set such that it has a minimum margin preventing a desired ground state from failing due to the second via holes 530.

Additional signal lines, for example, control signal lines for supplying control signals to drive the LCD device, may be formed on the second layer.

Although not shown, the second signal lines may be electrically connected with the first signal lines formed on the first layer, through third via holes (FIG. 2) passing through the first layer, first insulating layer, ground layer, second insulating layer, power supply layer, third insulating layer, and second layer.

After an impedance measurement for the multilayer PCB according to the second embodiment of the present invention and a conventional multilayer PCB, which includes a first layer, a first insulating layer, a ground layer, a second insulating layer, a power supply layer, and a second layer, it could be confirmed that the multilayer PCB according to the second embodiment of the present invention exhibits superior impedance matching.

In detail, in the conventional multilayer PCB, the impedance of the LVDS signal line group was 104.5$\Omega$, whereas the impedance of the mini-LVDS signal line group was 110.82Ω, so that the impedance difference therebetween was 6.32Ω.

On the other hand, in the multilayer PCB according to the second embodiment of the present invention, the impedance of the LVDS signal line group was 100.5Ω, whereas the impedance of the mini-LVDS signal line group was 100.03Ω, so that the impedance difference therebetween was 0.47Ω. Thus, it was confirmed that the multilayer PCB according to the second embodiment of the present invention provide an effect of an enhancement in impedance matching.

Figure 8A:
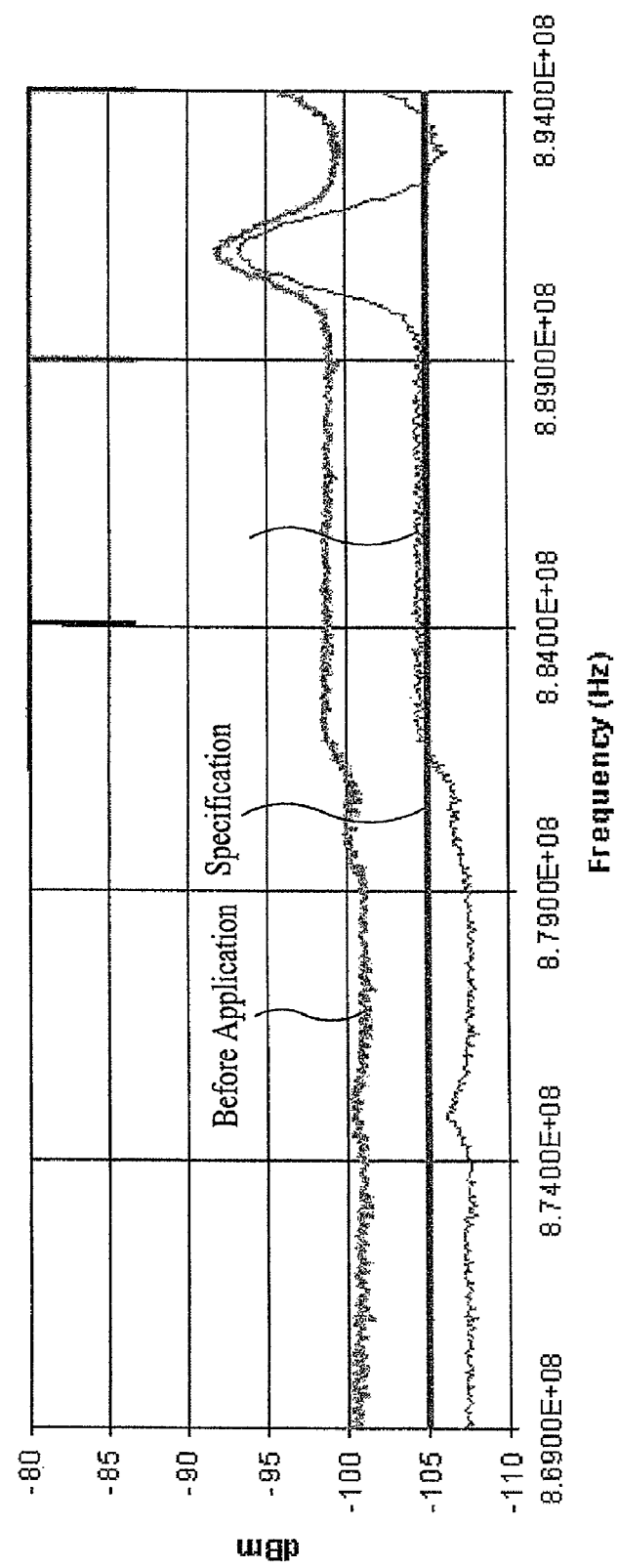
FIGS. 8A, 8B, 9A, 9B, 10A, 10B, 11A, 11B, 12A, 12B, 13A, 13B, 14A, 14B, 15A, 15B, 16A and 16B are graphs depicting respective variations in WWAN noise occurring before and after the multilayer PCB according to the embodiment of the present invention is applied, in various frequency band widths (BW of FIGS. 8A, 8B, 9A, 9B, 10A, 10B, 11A, 11B, 12A, 12B, 13A, 13B, 14A, 14B, 15A, 15B, 16A and 16B), respectively.

FIG. 8A is a graph depicting respective variations in WWAN noise occurring before the multilayer PCB according to the embodiment of the present invention is applied, namely, when the conventional multilayer PCB is applied, and after the multilayer PCB according to the embodiment of the present invention is applied, under the condition in which a main antenna supporting two or more frequencies in a 850 code division multiple access (CDMA) band width (1.2 MHz; BW of FIG. 8A) is used.

Figure 8B:
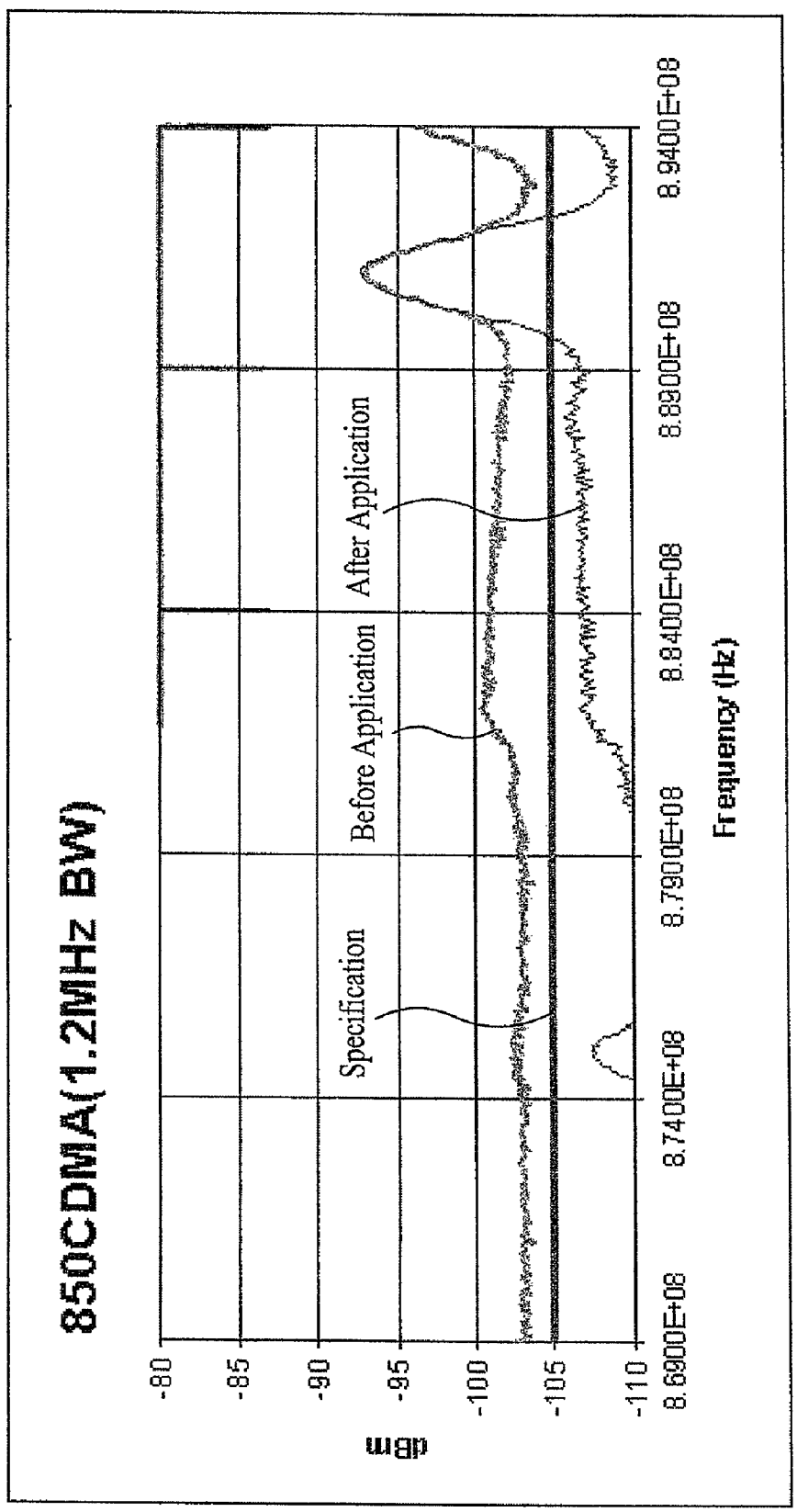

FIG. 8B is a graph depicting respective variations in WWAN noise occurring before and after the multilayer PCB according to the embodiment of the present invention is applied, under the condition in which a modulated antenna is used in the 850 CDMA band width (1.2 MHz; BW of FIG. 8B).

For reference, the line labeled with "Before Application" (FIGS. 8A, 8B, 9A, 9B, 10A, 10B, 11A, 11B, 12A, 12B, 13A, 13B, 14A, 14B, 15A, 15B, 16A and 16B) represents the case in which the conventional multilayer PCB is applied, whereas the line labeled with "After Application" (FIGS. 8B, 9A, 9B, 10A, 10B, 11A, 11B, 12A, 12B, 13A, 13B, 14A, 14B, 15A, 15B, 16A and 16B) represents the case in which the multilayer PCB according to the present invention is applied.

Figure 9A:
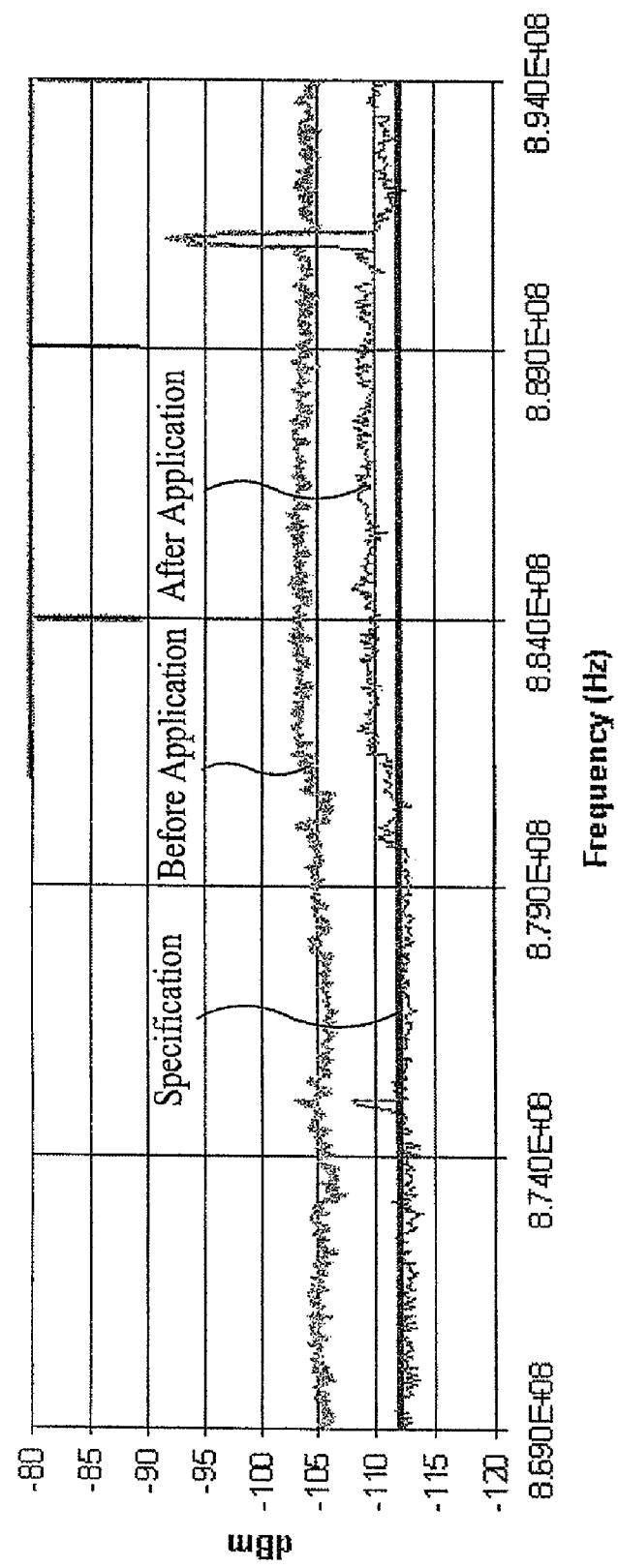
Figure 9B:
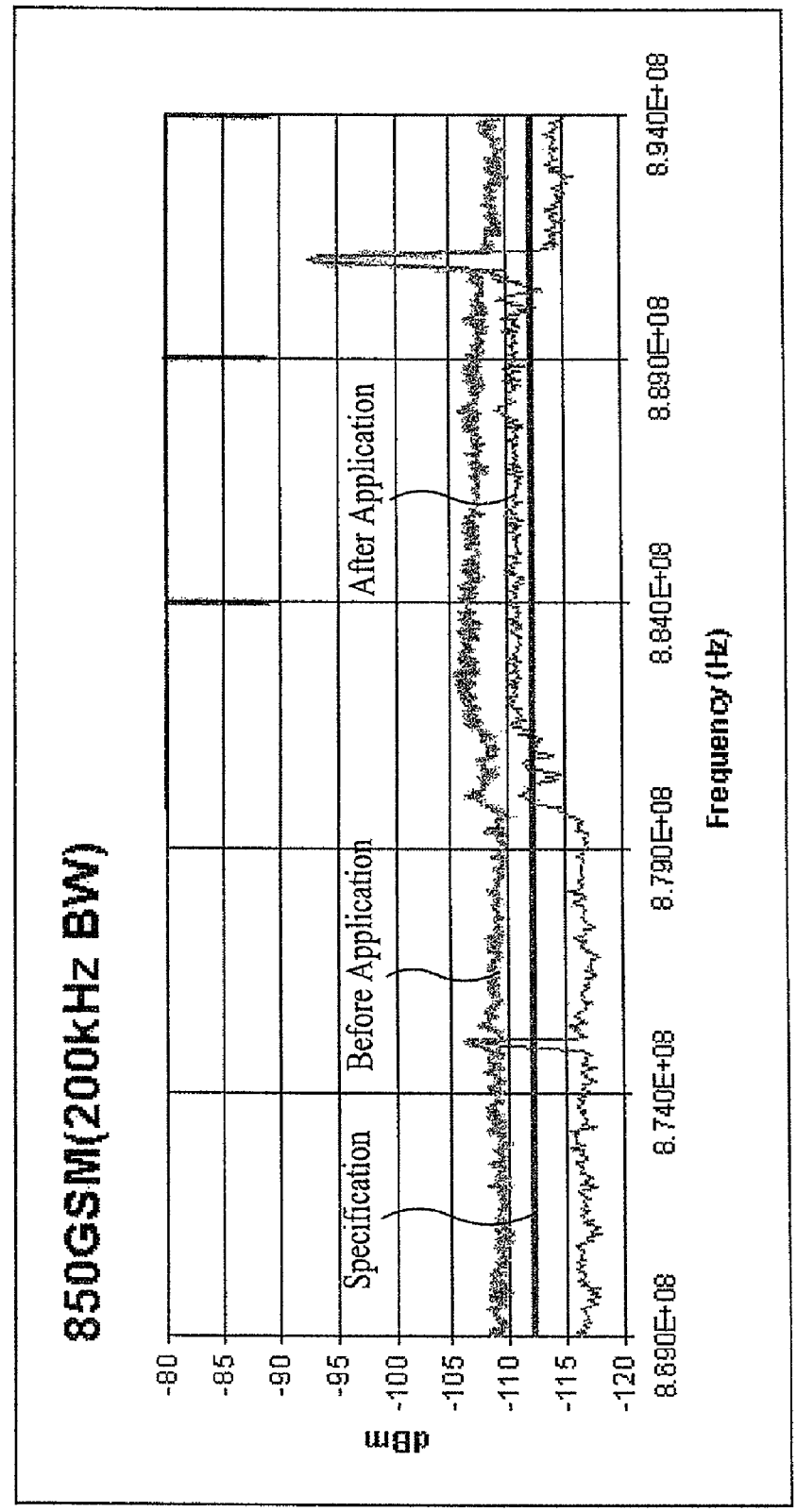

FIGS. 9A and 9B are graphs depicting respective variations in WWAN noise occurring before and after the multilayer PCB according to the embodiment of the present invention is applied, under the conditions in which a main antenna and a modulated antenna are used in the 850 global system for mobile (GSM) band width (200 kHz; BW of FIGS. 9A and 9B), respectively.

Figure 10A:
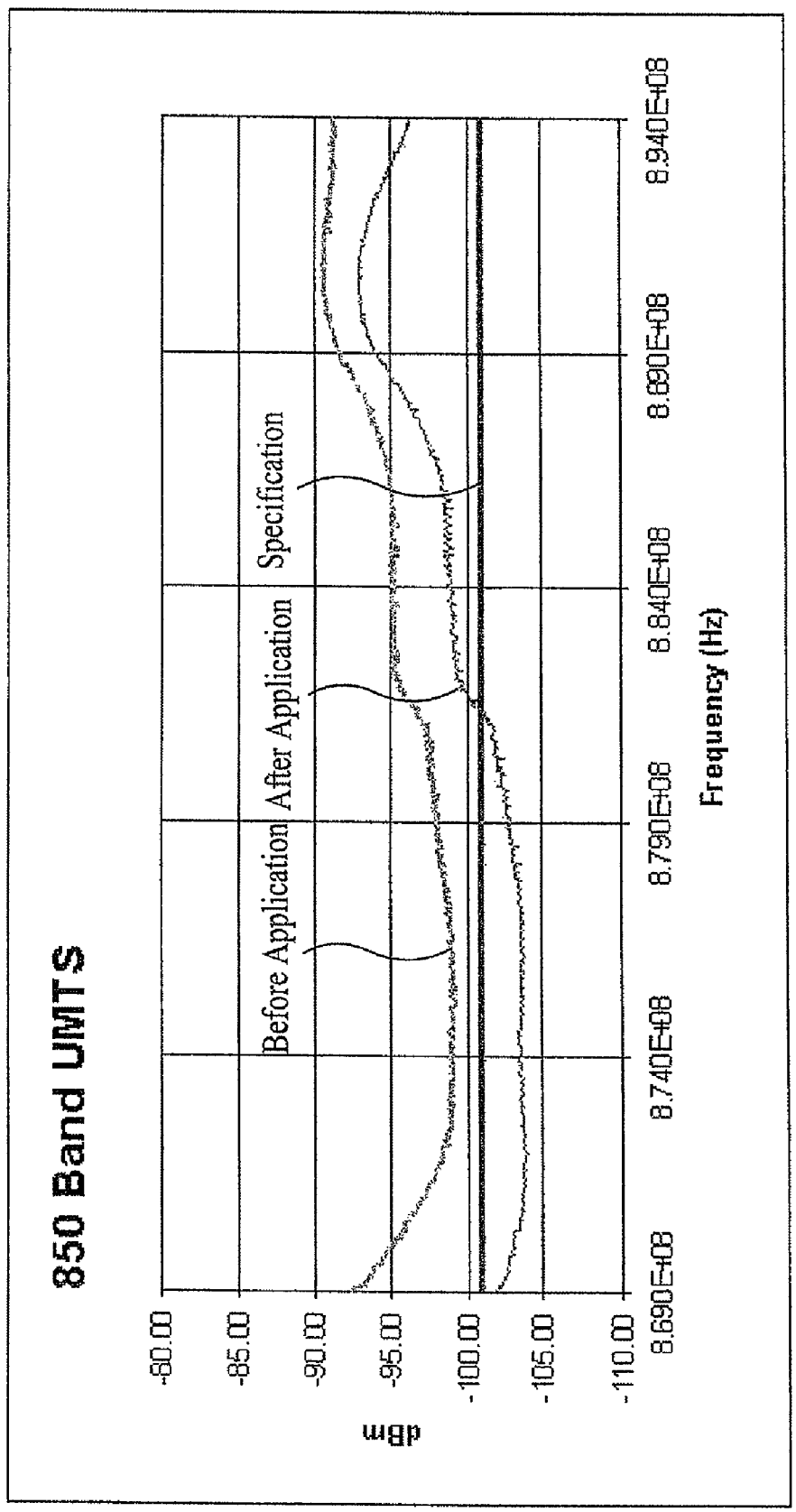
Figure 10B:
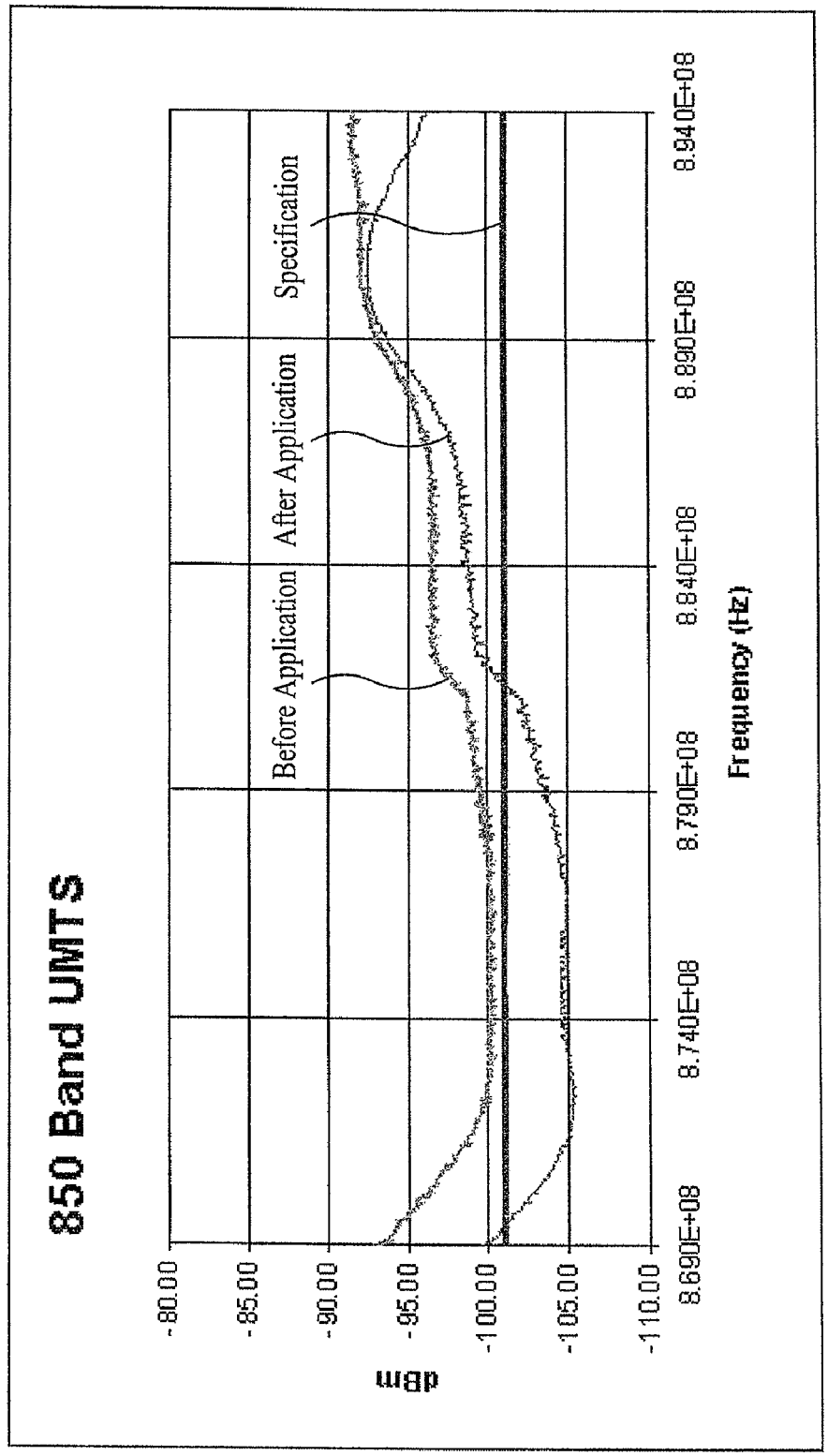

FIGS. 10A and 10B are graphs depicting respective variations in WWAN noise occurring before and after the multilayer PCB according to the embodiment of the present invention is applied, under the conditions in which a main antenna and a modulated antenna are used in the 850 universal mobile telecommunications system (UMTS) band width (BW of FIGS. 10A and 10B), respectively.

Figure 11A:
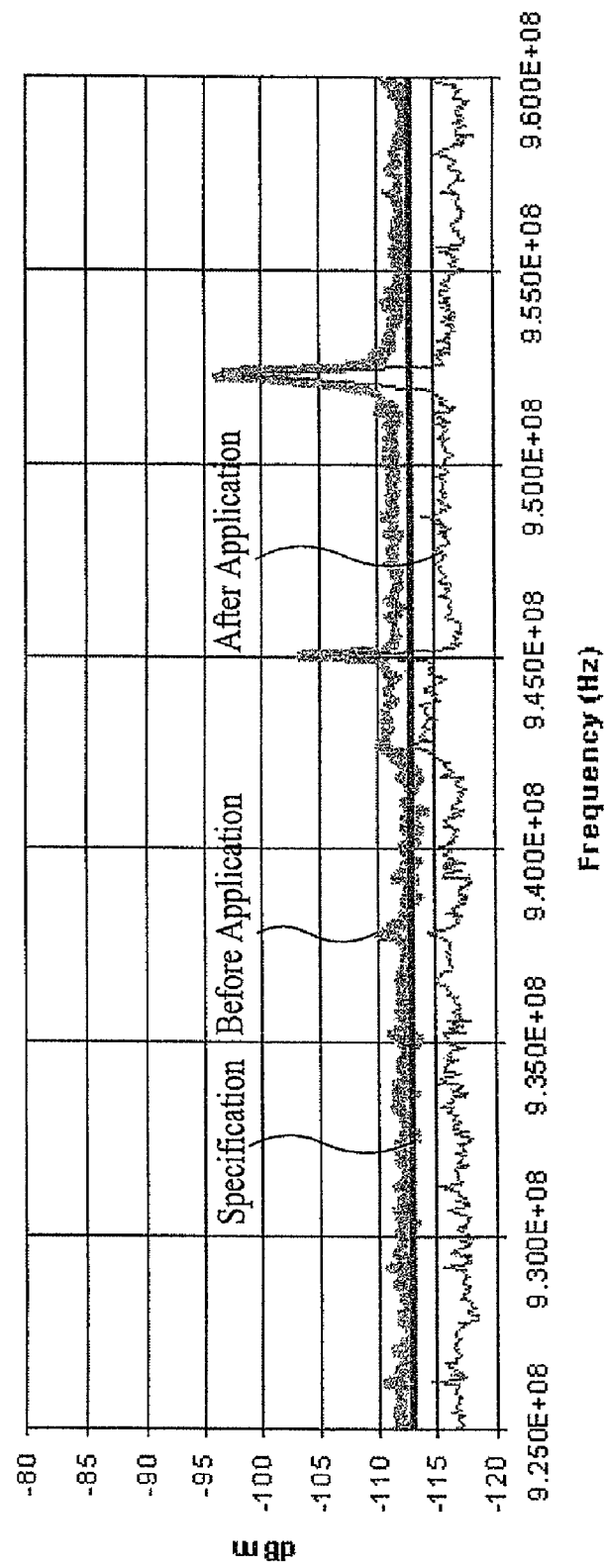
Figure 11B:
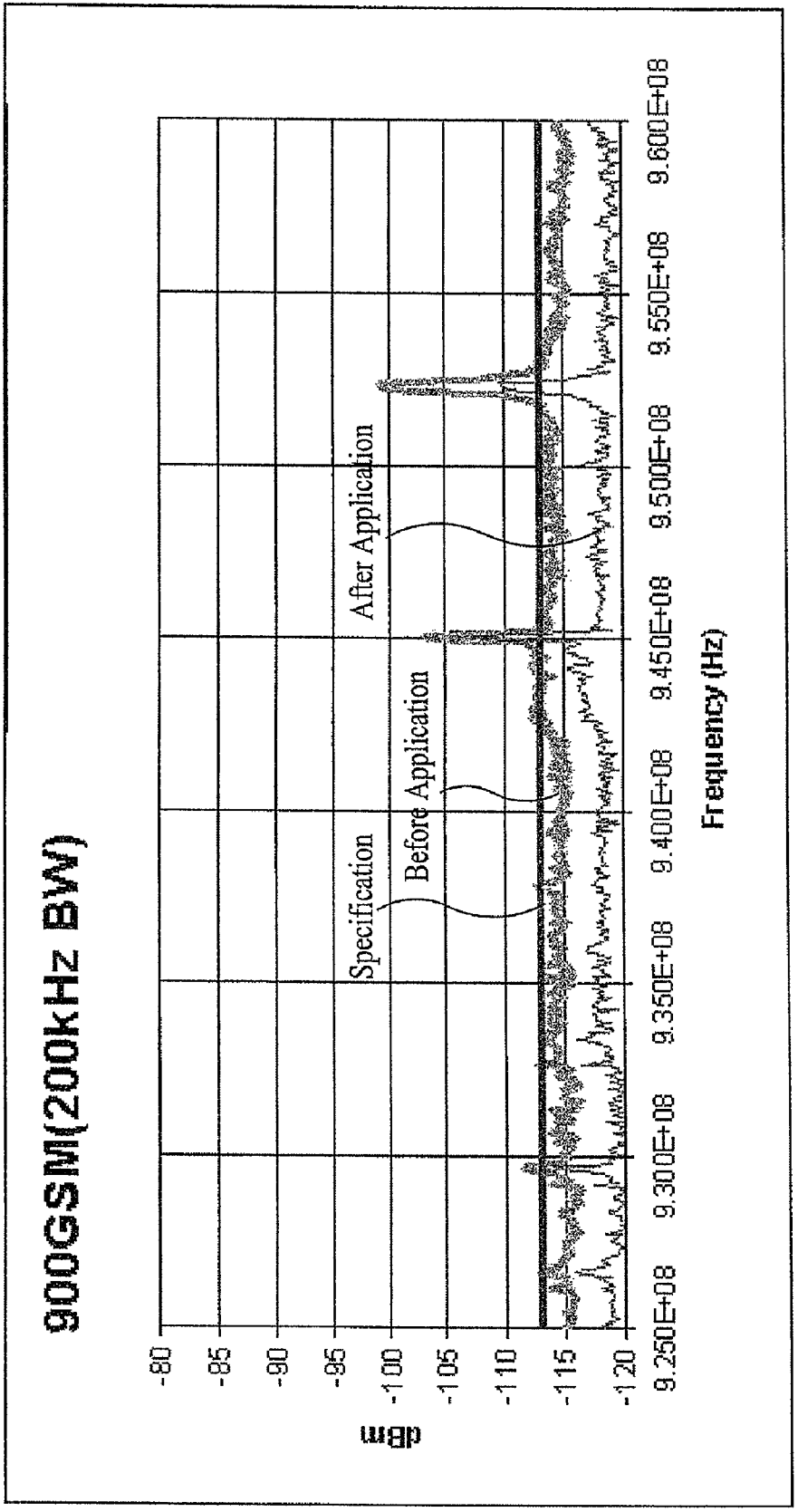

FIGS. 11A and 11B are graphs depicting respective variations in WWAN noise occurring before and after the multilayer PCB according to the embodiment of the present invention is applied, under the conditions in which a main antenna and a modulated antenna are used in the 900 GSM band width (200 kHz; BW of FIGS. 11A and 11B), respectively.

Figure 12A:
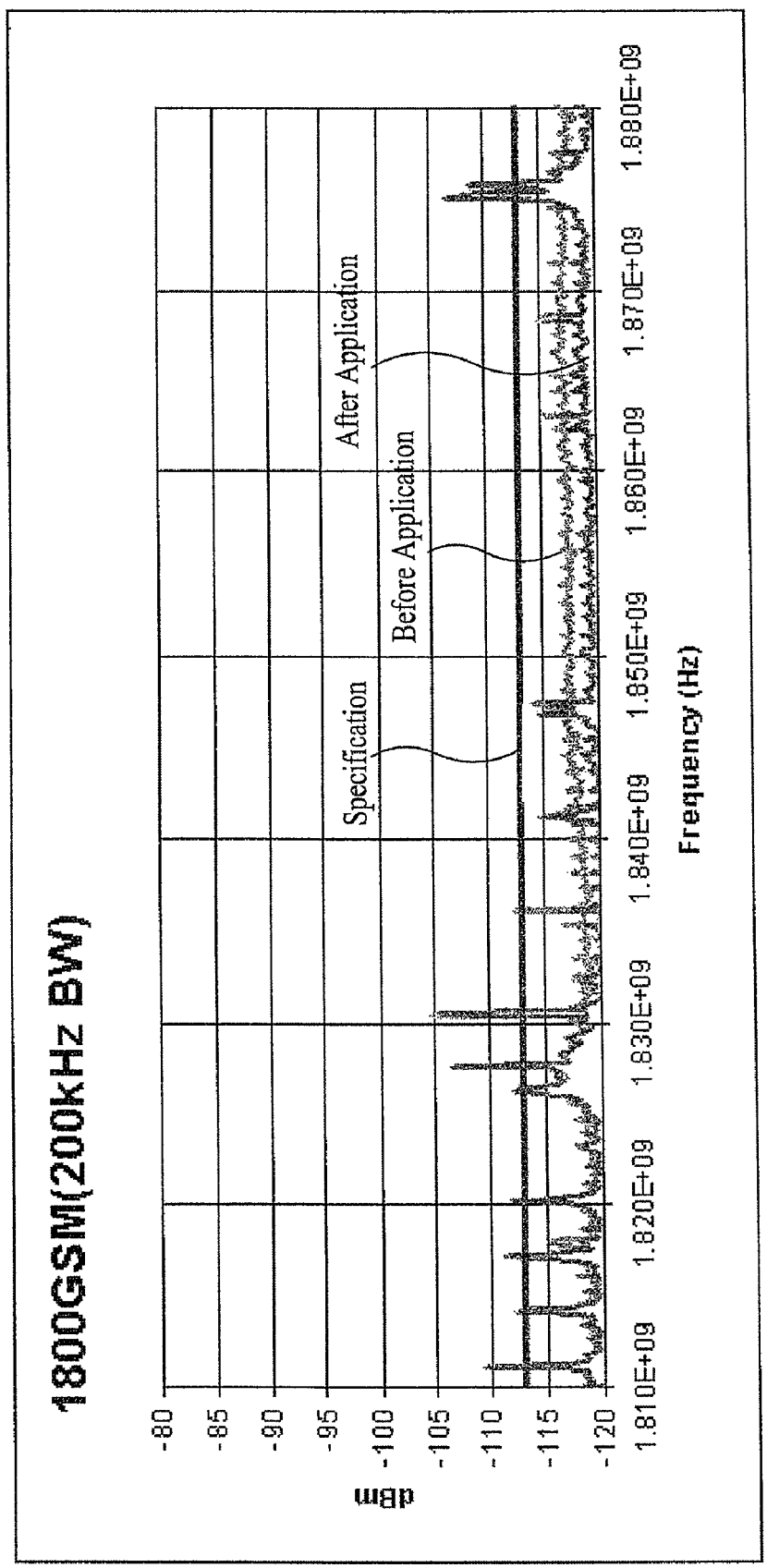
Figure 12B:
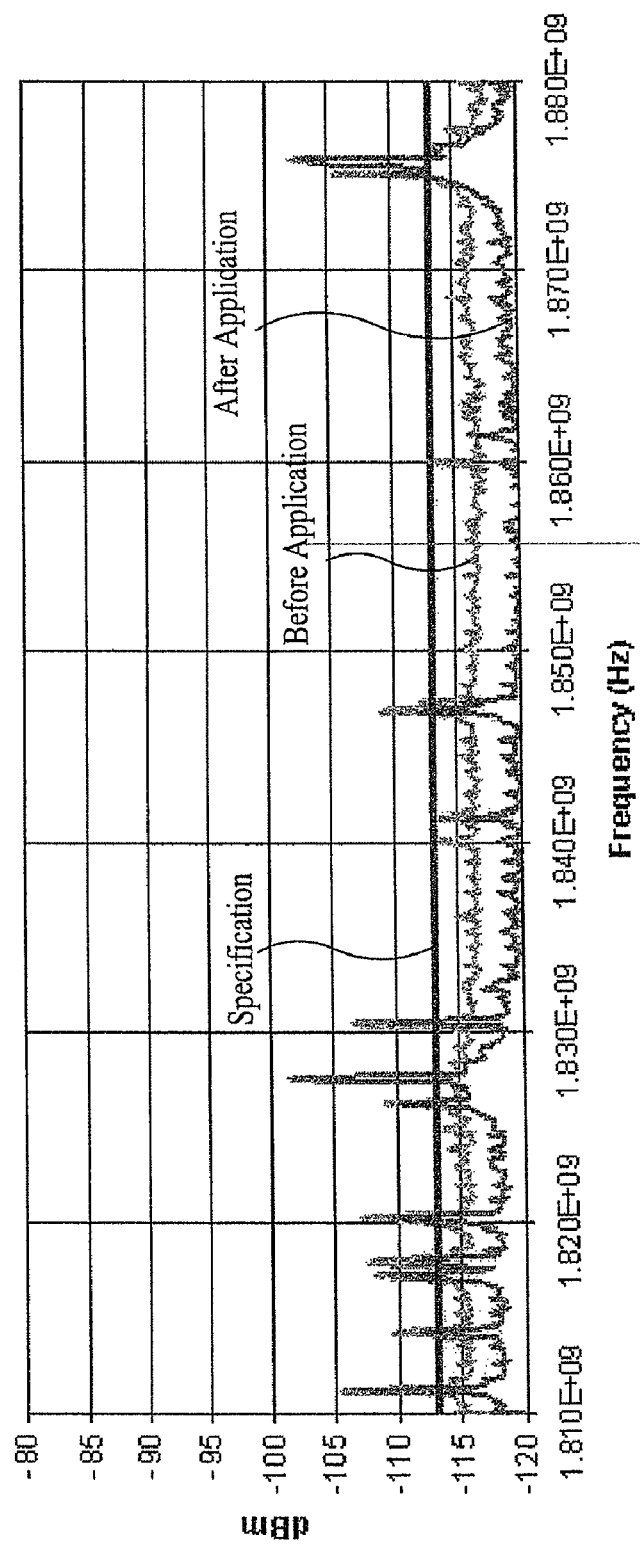

FIGS. 12A and 12B are graphs depicting respective variations in WWAN noise occurring before and after the multilayer PCB according to the embodiment of the present invention is applied, under the conditions in which a main antenna and a modulated antenna are used in the 1,800 GSM band width (200 kHz; BW of FIGS. 12A and 12B), respectively.

Figure 13A:
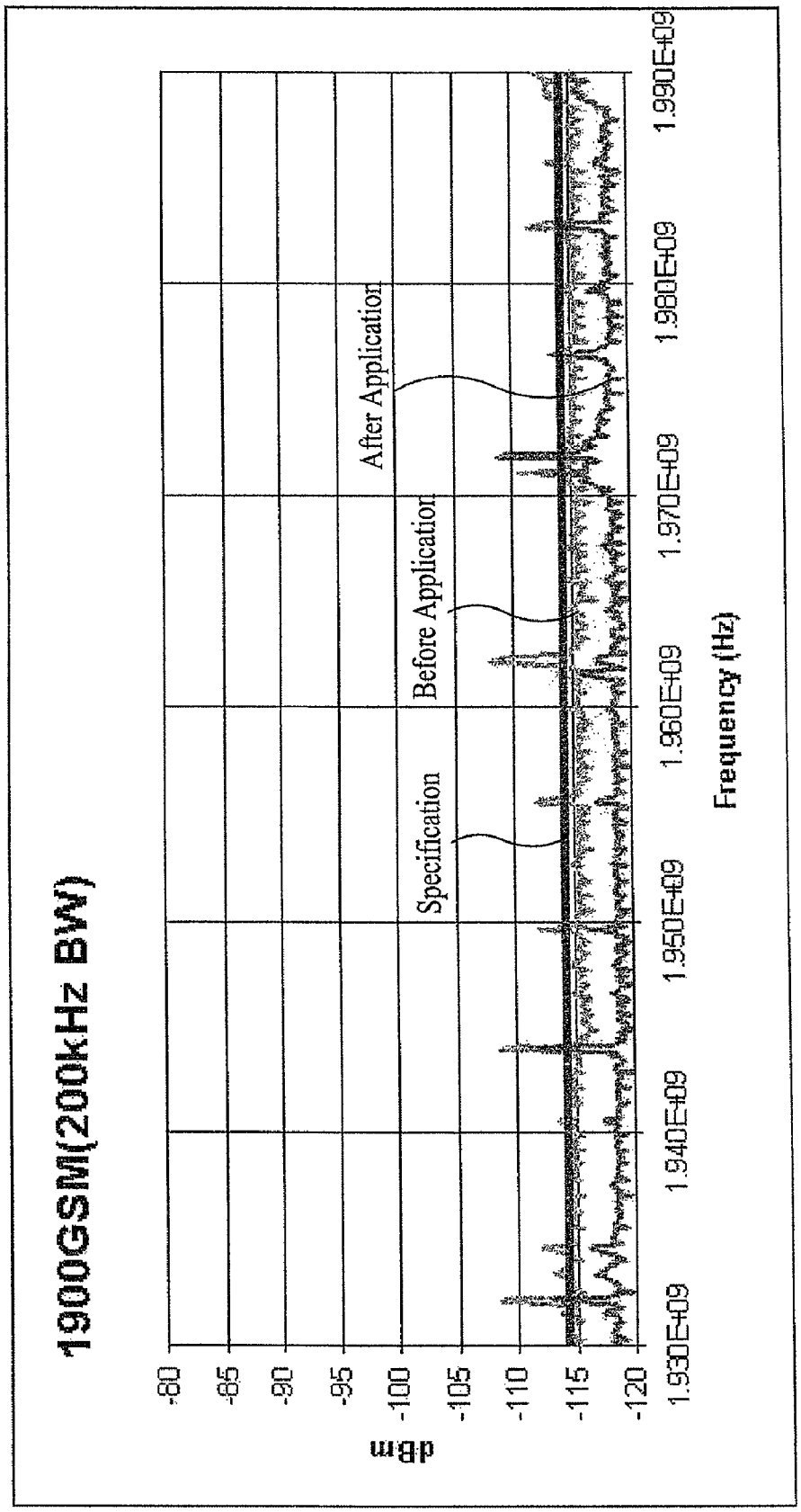
Figure 13B:
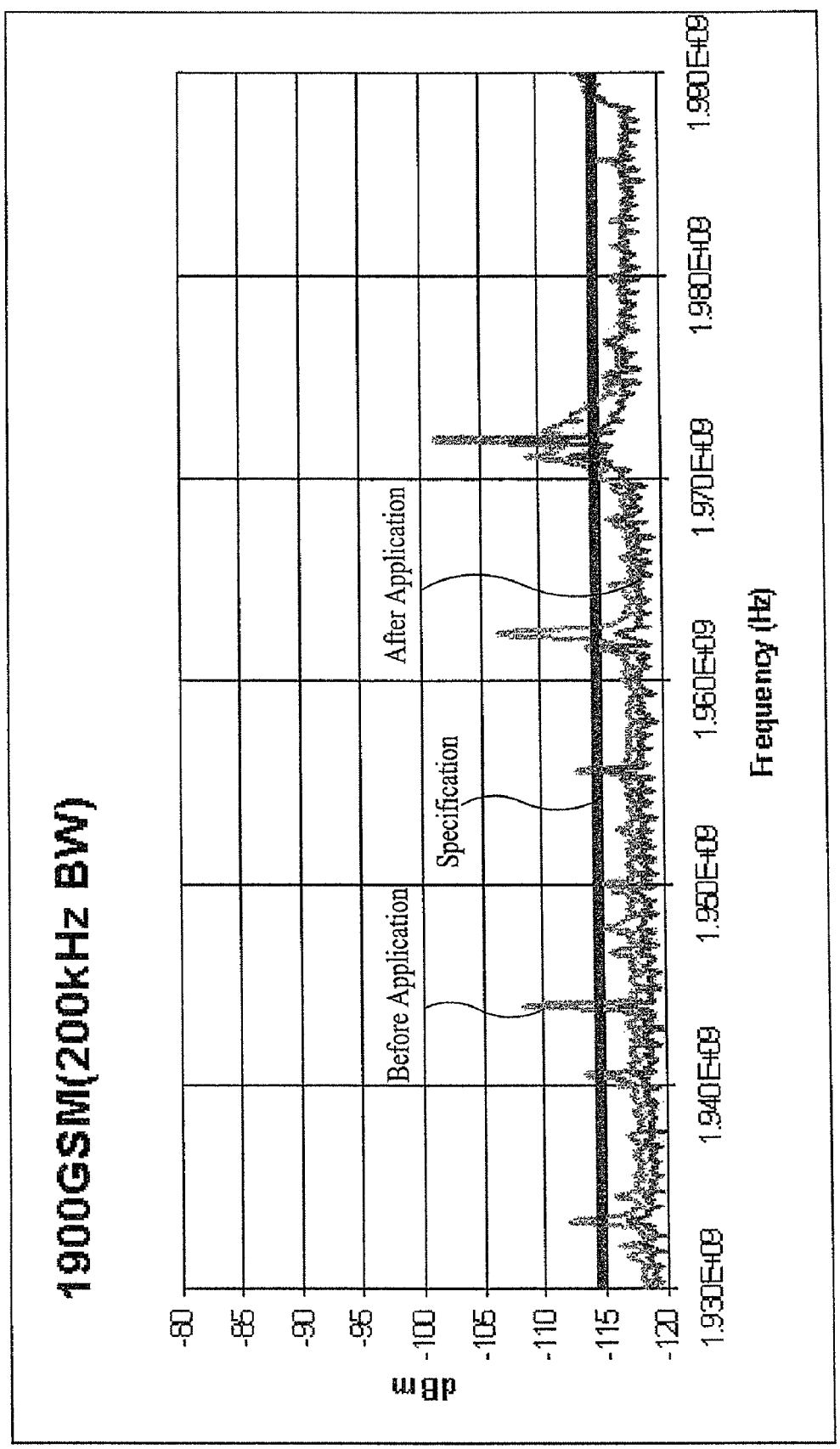

FIGS. 13A and 13B are graphs depicting respective variations in WWAN noise occurring before and after the multilayer PCB according to the embodiment of the present invention is applied, under the conditions in which a main antenna and a modulated antenna are used in the 1,900 GSM band width (200 kHz; BW of FIGS. 13A and 13B), respectively.

Figure 14A:
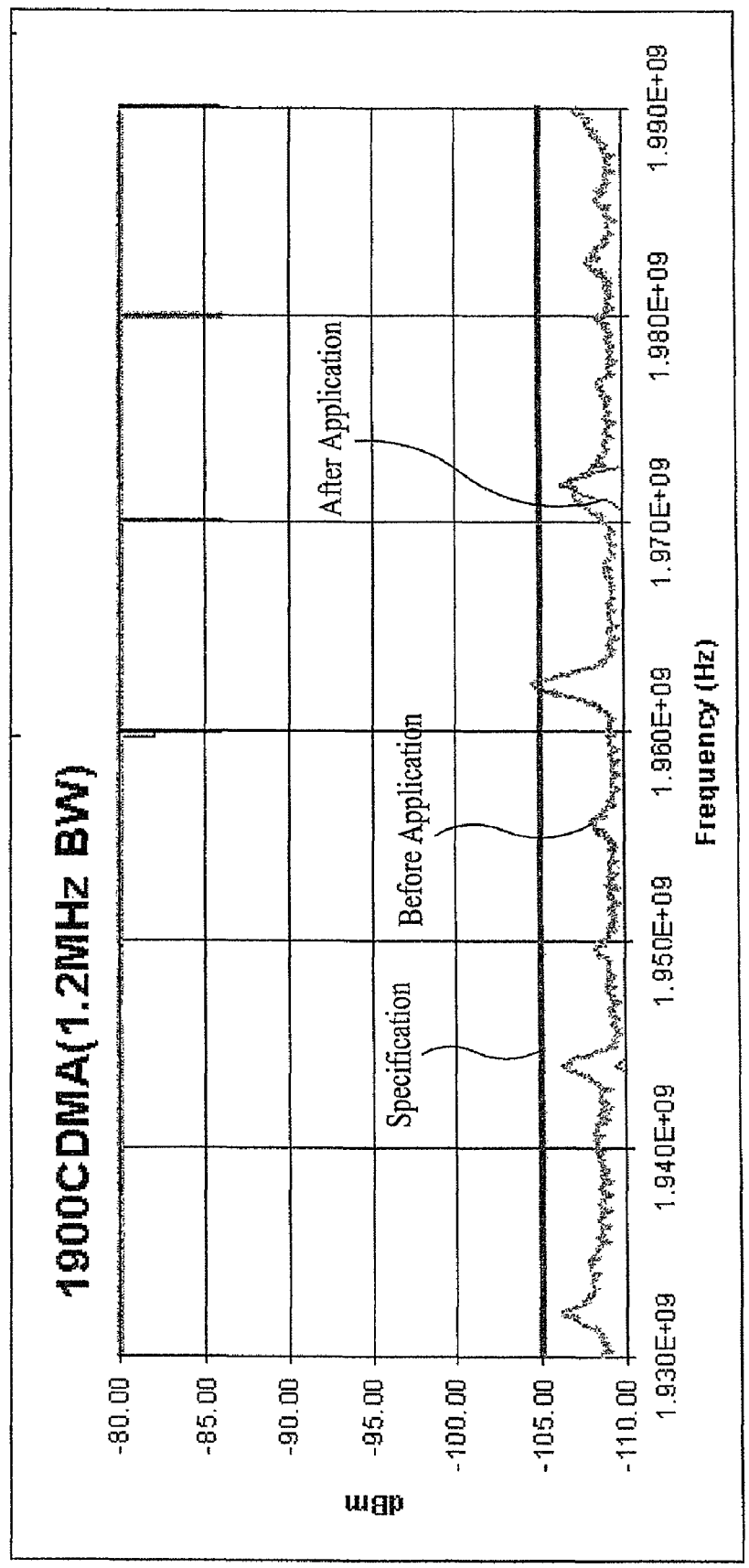
Figure 14B:
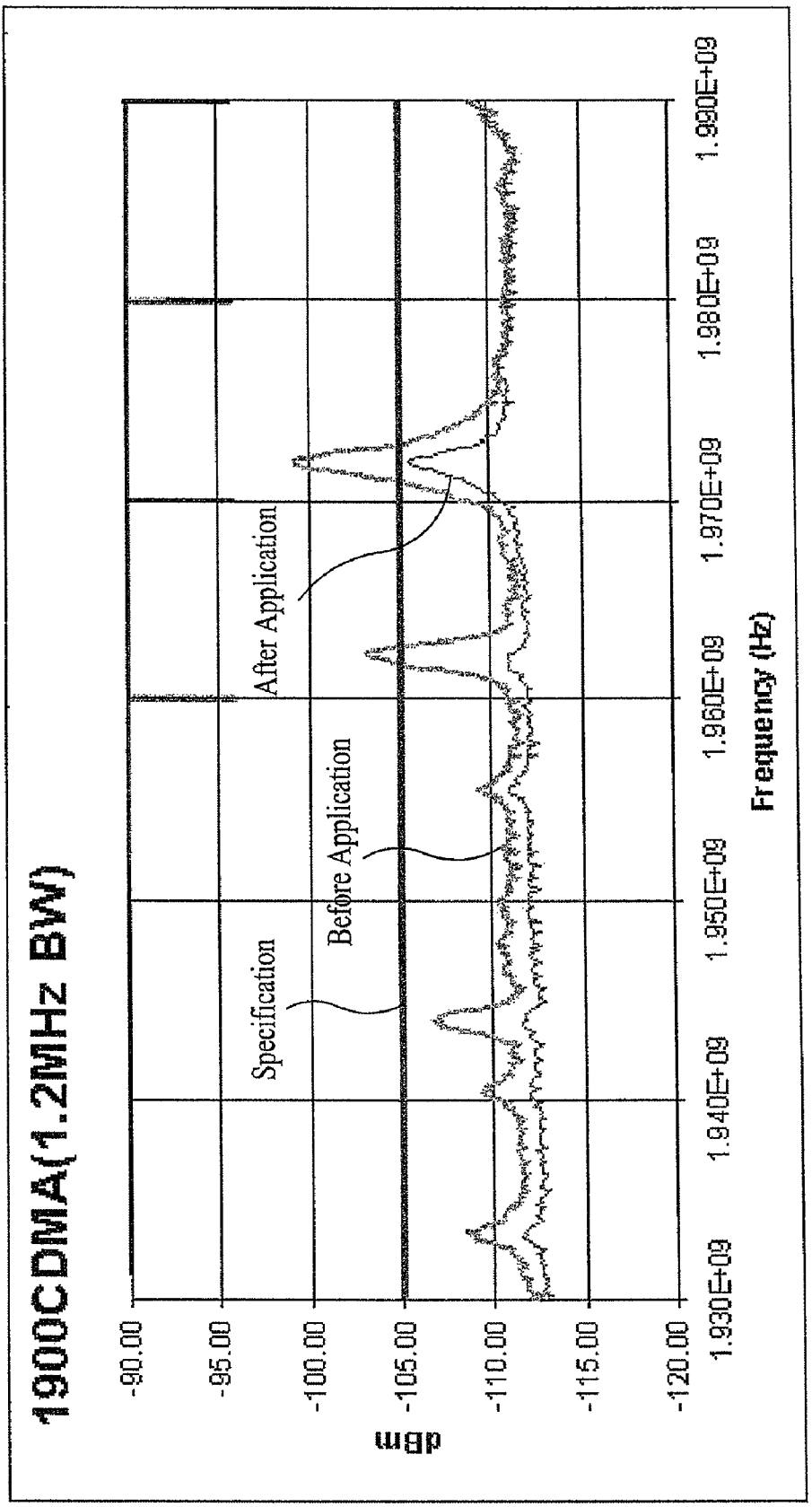

FIGS. 14A and 14B are graphs depicting respective variations in WWAN noise occurring before and after the multilayer PCB according to the embodiment of the present invention is applied, under the conditions in which a main antenna and a modulated antenna are used in the 1,900 CDMA band width (1.2 MHz; BW of FIGS. 14A and 14B), respectively.

Figure 15A:
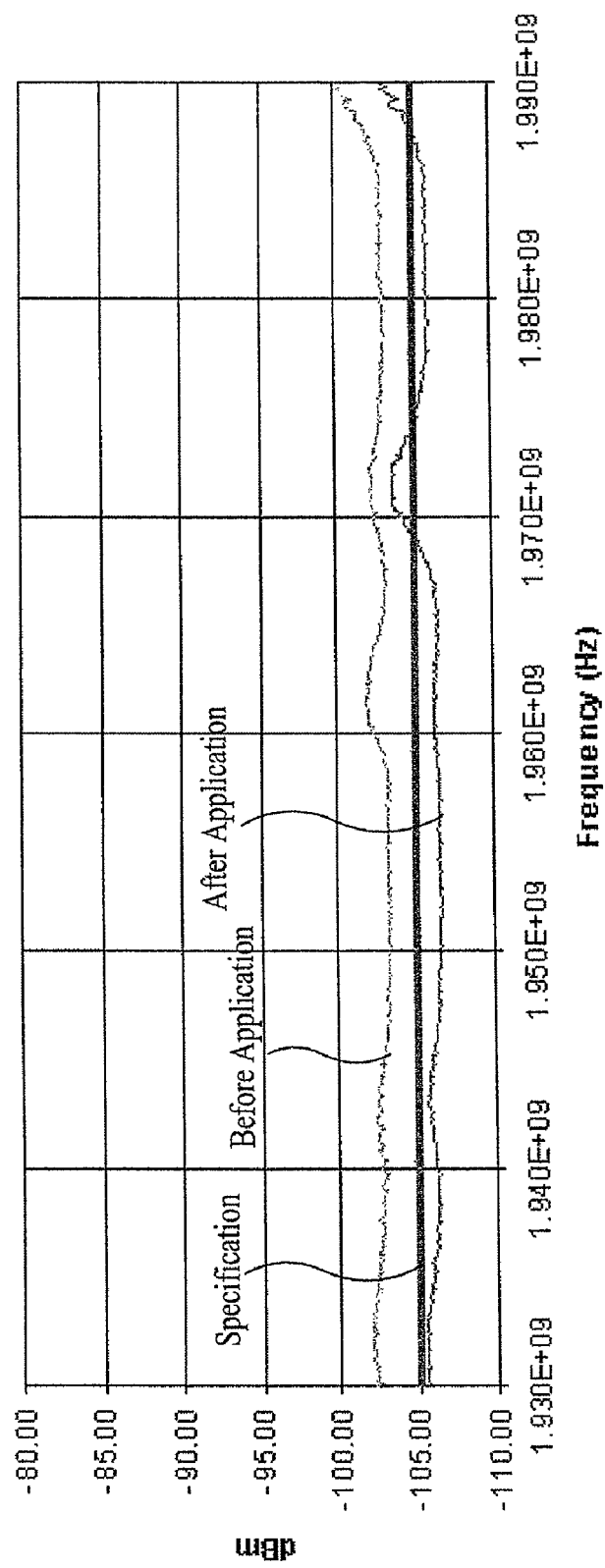
Figure 15B:
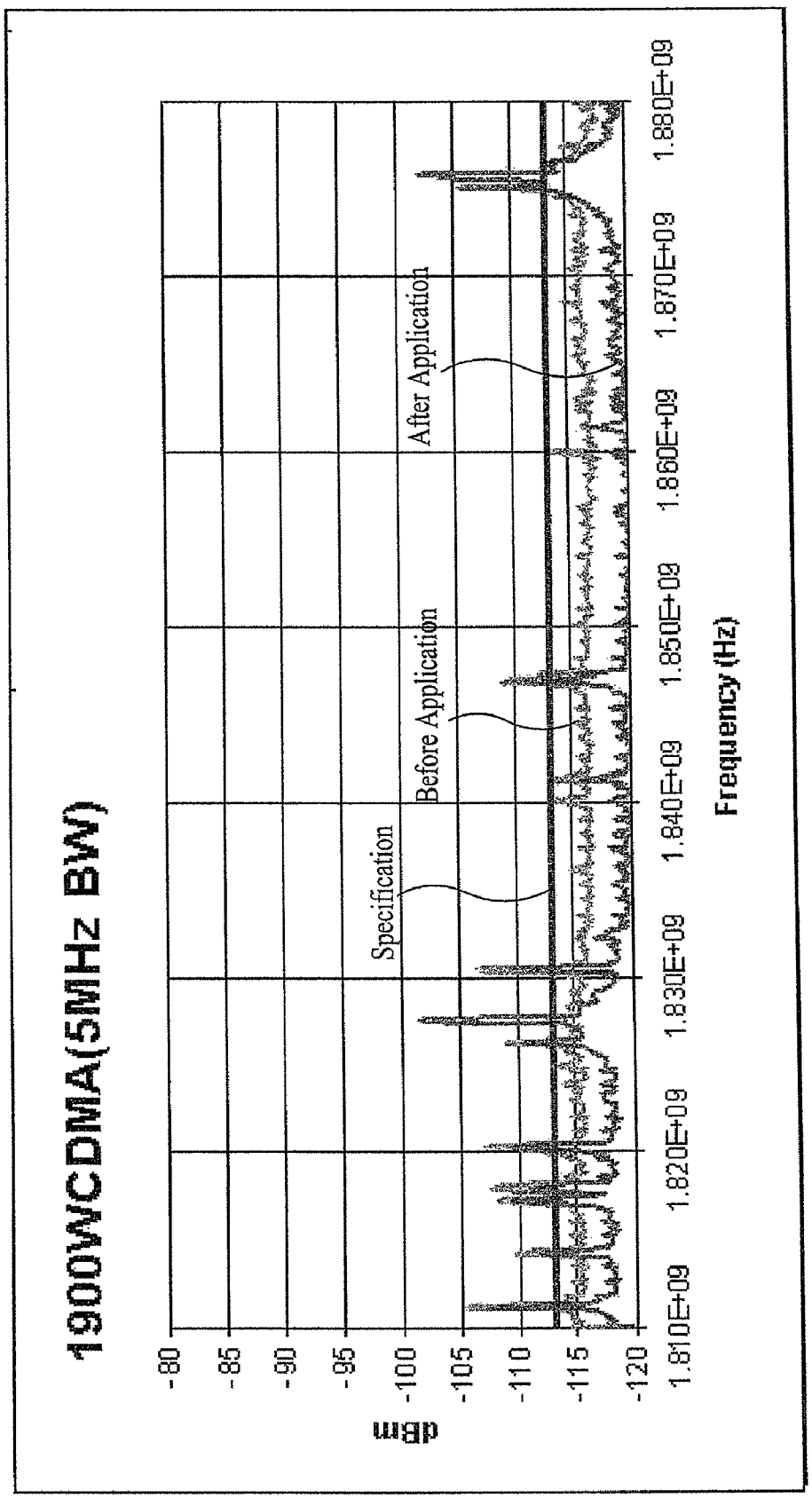

FIGS. 15A and 15B are graphs depicting respective variations in WWAN noise occurring before and after the multilayer PCB according to the embodiment of the present invention is applied, under the conditions in which a main antenna and a modulated antenna are used in the 1,900 WCDMA band width (5 MHz; BW of FIGS. 15A and 15B), respectively.

Figure 16A:
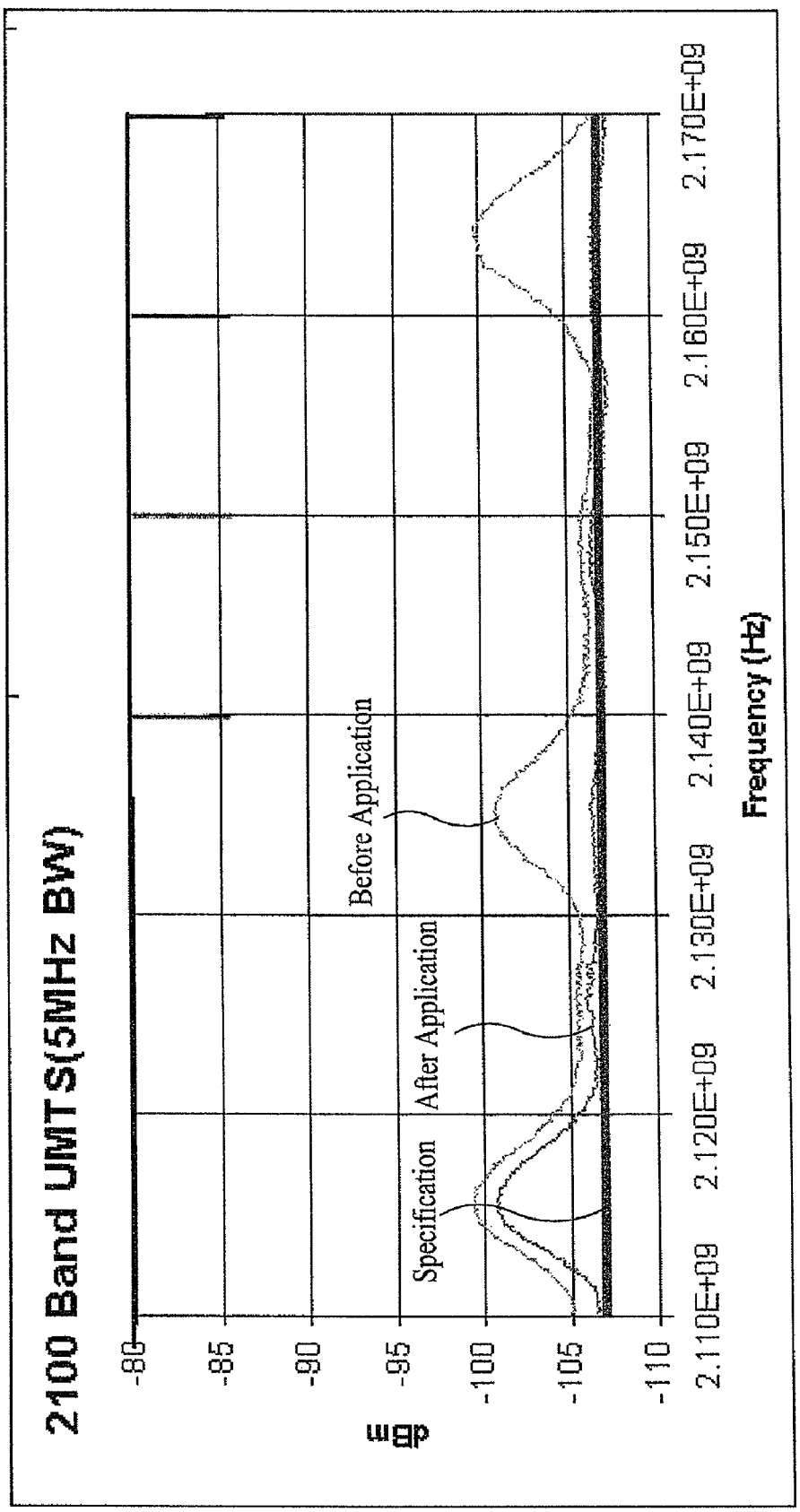
Figure 16B:
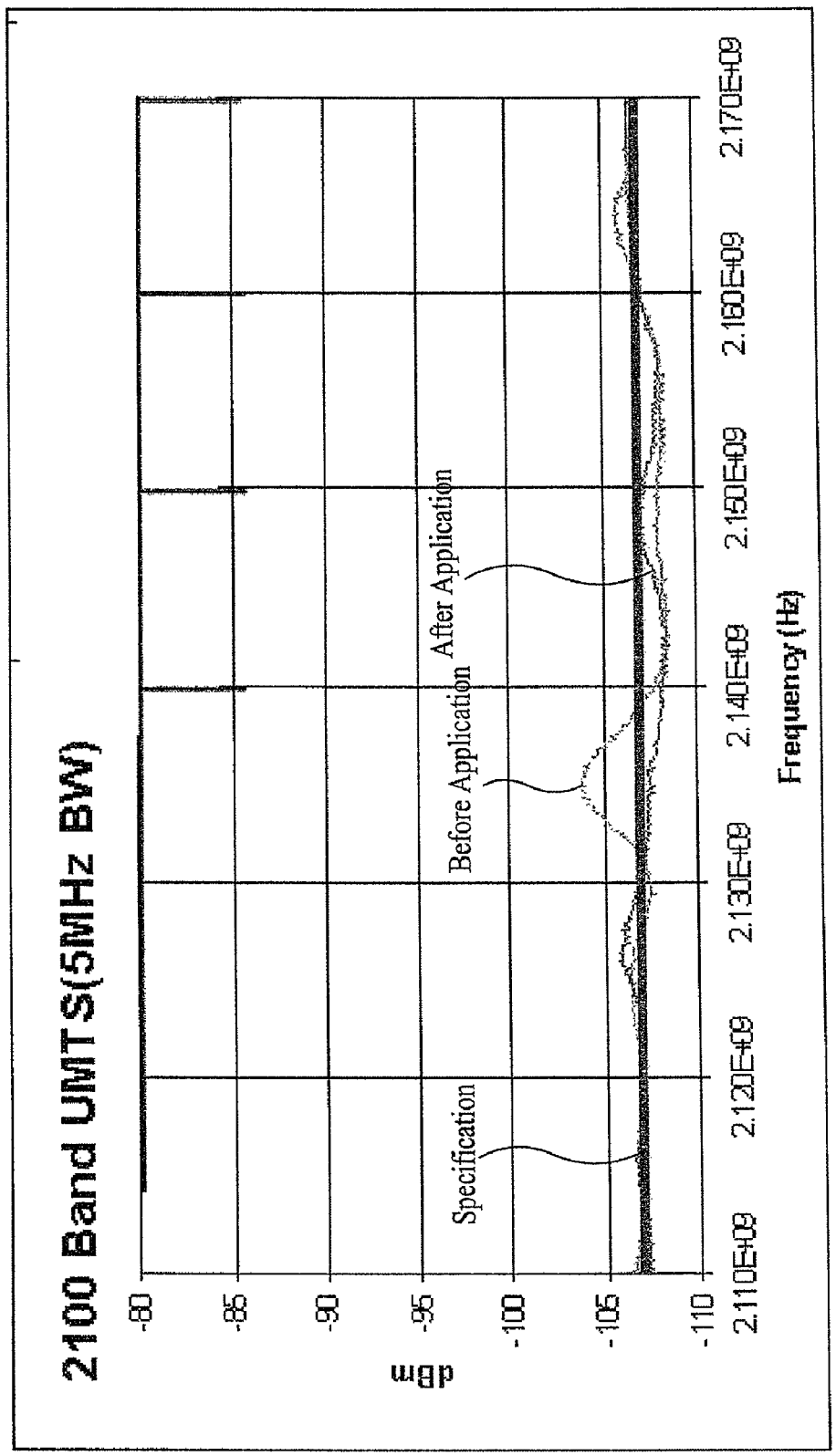

FIGS. 16A and 16B are graphs depicting respective variations in WWAN noise occurring before and after the multilayer PCB according to the embodiment of the present invention is applied, under the conditions in which a main antenna and a modulated antenna are used in the 2,100 UMTS band width (5 MHz; BW of FIGS. 16A and 16B), respectively.

Referring to FIGS. 8A, 8B, 9A, 9B, 10A, 10B, 11A, 11B, 12A, 12B, 13A, 13B, 14A, 14B, 15A, 15B, 16A and 16B, it can be seen that, although WWAN noise generated before the application of the multilayer PCB according to the present invention is out of a specification range (a line labeled with "Specification" of FIGS. 8A, 8B, 9A, 9B, 10A, 10B, 11A, 11B, 12A, 12B, 13A, 13B, 14A, 14B, 15A, 15B, 16A and 16B) in most cases, irrespective of the kind of the antenna used, WWAN noise generated after the application of the multilayer PCB according to the present invention is near or within the specification range. In particular, it can be seen that a remarkable WWAN noise decrease effect is obtained in a low band width.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A multilayer printed circuit board comprising a first layer, a first insulating layer, a ground layer, a second insulating layer, a power supply layer, a third insulating layer, and a second layer, which are sequentially laminated, further comprising:

a plurality of first signal lines disposed on the first layer, to receive a first signal;

first isolation patterns disposed on the first layer such that the first isolation patterns are arranged between adjacent ones of the plurality of first signal lines, respectively, while being electrically isolated from the plurality of first signal lines;

a plurality of first ground lines disposed on the ground layer such that the plurality of first ground lines correspond to the first isolation patterns, respectively, the plurality of first ground lines being connected to ground;

a plurality of second signal lines disposed on the second layer, to receive a second signal;

second isolation patterns disposed on the second layer such that the second isolation patterns are arranged between adjacent ones of the plurality of second signal lines, respectively, while being electrically isolated from the plurality of second signal lines; and a plurality of second ground lines arranged on the power supply layer such that the plurality of second ground lines are in corresponding alignment correspond to the second isolation patterns, respectively, the plurality of second ground lines being connected to the ground;

first connecting patterns disposed on the ground layer such that the first connecting patterns intersect with the plurality of first ground lines.

2. The multilayer printed circuit board according to claim 1, wherein each of the first and second isolation patterns is provided with at least one via hole for electrically connecting the isolation pattern to a corresponding one of the plurality of first and second ground lines.

3. The multilayer printed circuit board according to claim 2, wherein the at least one via hole comprises a plurality of via holes, and the plurality of via holes have a spacing of about 6 mm.

4. The multilayer printed circuit board according to claim 1, wherein the plurality of first ground lines and the plurality of second ground lines are electrically connected by via holes passing through the ground layer, the second insulating layer, and the power supply layer.

5. The multilayer printed circuit board according to claim 1, wherein the plurality of second ground lines have a floated structure.

6. The multilayer printed circuit board according to claim 1, further comprising:
    second connecting patterns disposed on the power supply layer such that the second connecting patterns intersect with the plurality of second ground lines.

7. The multilayer printed circuit board according to claim 6, wherein via holes are formed at intersections of the plurality of second ground lines and the second connecting patterns, respectively, to electrically connect the plurality of second ground lines to the second isolation patterns.

8. The multilayer printed circuit board according to claim 1, wherein the first isolation patterns and the plurality of first ground lines are electrically connected by first via holes passing through the first layer, the first insulating layer, and the ground layer.

9. The multilayer printed circuit board according to claim 1, wherein the second isolation patterns and the plurality of second ground lines are electrically connected by second via holes passing through the second layer, the second insulating layer, and the power supply layer.

10. The multilayer printed circuit board according to claim 1, wherein at least one of each first signal line and each second signal line comprises a pair of sub-lines.

11. The multilayer printed circuit board according to claim 1, wherein each first signal line and each second signal line are electrically connected by third via holes passing through the first layer, the first insulating layer, the ground layer, the second insulating layer, the power supply layer, the third insulating layer, and the second layer.

12. The multilayer printed circuit board according to claim 1, wherein the plurality of first ground lines have a floated structure; or,
    wherein one ends of the plurality of first ground lines are connected to each other, and the other ends of the plurality of first ground lines are connected to each other.

* * * * *